United States Patent
Yuh et al.

(10) Patent No.: US 11,776,595 B2
(45) Date of Patent: Oct. 3, 2023

(54) MEMORY DEVICE WITH SOURCE LINE CONTROL

(71) Applicant: Taiwan Semiconductor Manufacturing Company, Ltd., Hsinchu (TW)

(72) Inventors: Perng-Fei Yuh, Hsinchu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/584,127

(22) Filed: Jan. 25, 2022

(65) Prior Publication Data

US 2023/0238042 A1    Jul. 27, 2023

(51) Int. Cl.
*G11C 7/10* (2006.01)
*G11C 8/08* (2006.01)
*G11C 7/12* (2006.01)
*G11C 11/407* (2006.01)
*G11C 17/18* (2006.01)
*G11C 11/16* (2006.01)

(52) U.S. Cl.
CPC .......... *G11C 7/1096* (2013.01); *G11C 7/1069* (2013.01); *G11C 7/12* (2013.01); *G11C 8/08* (2013.01); *G11C 11/165* (2013.01); *G11C 11/407* (2013.01); *G11C 17/18* (2013.01)

(58) Field of Classification Search
CPC ....... G11C 7/1096; G11C 7/1069; G11C 7/12; G11C 8/08; G11C 11/165; G11C 11/407; G11C 17/18
USPC .......................................................... 365/141
See application file for complete search history.

(56) References Cited

U.S. PATENT DOCUMENTS

2009/0067229 A1* 3/2009 Kang ................... G11C 13/003
                                                                    365/171
2020/0227476 A1* 7/2020 Tomita ................ H01L 45/1253

* cited by examiner

*Primary Examiner* — Huan Hoang
(74) *Attorney, Agent, or Firm* — FOLEY & LARDNER LLP

(57) ABSTRACT

Disclosed herein are related to a memory device including a set of memory cells and a memory controller. In one aspect, each of the set of memory cells includes a select transistor and a storage element connected in series between a corresponding bit line and a corresponding source line. In one aspect, the memory controller is configured to apply a first write voltage to a bit line coupled to a selected memory cell, apply a second write voltage to a word line coupled to a gate electrode of a select transistor of the selected memory cell during a first time period, and apply a third write voltage to a source line coupled to the selected memory cell. The second write voltage may be between the first write voltage and the third write voltage.

19 Claims, 23 Drawing Sheets

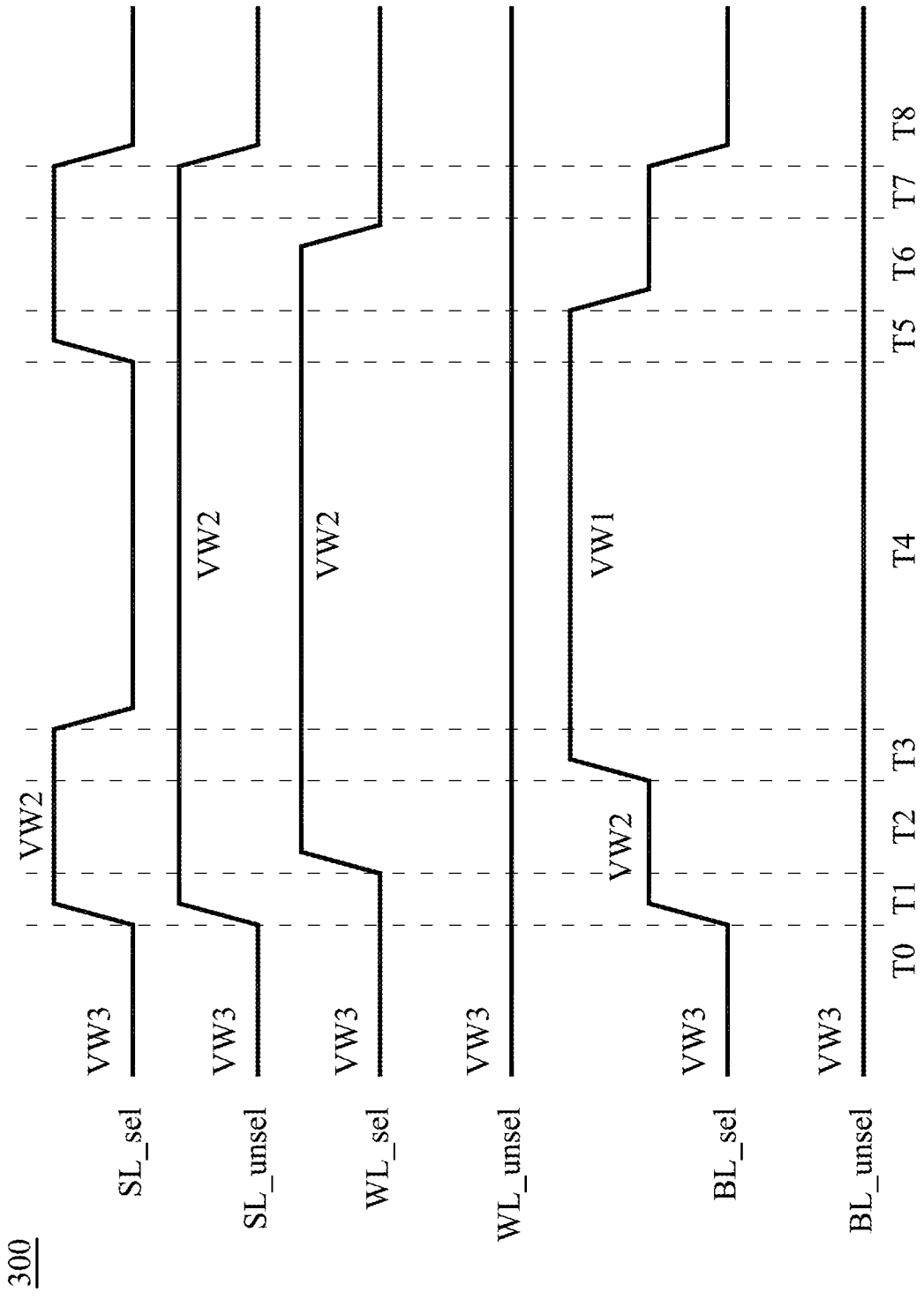

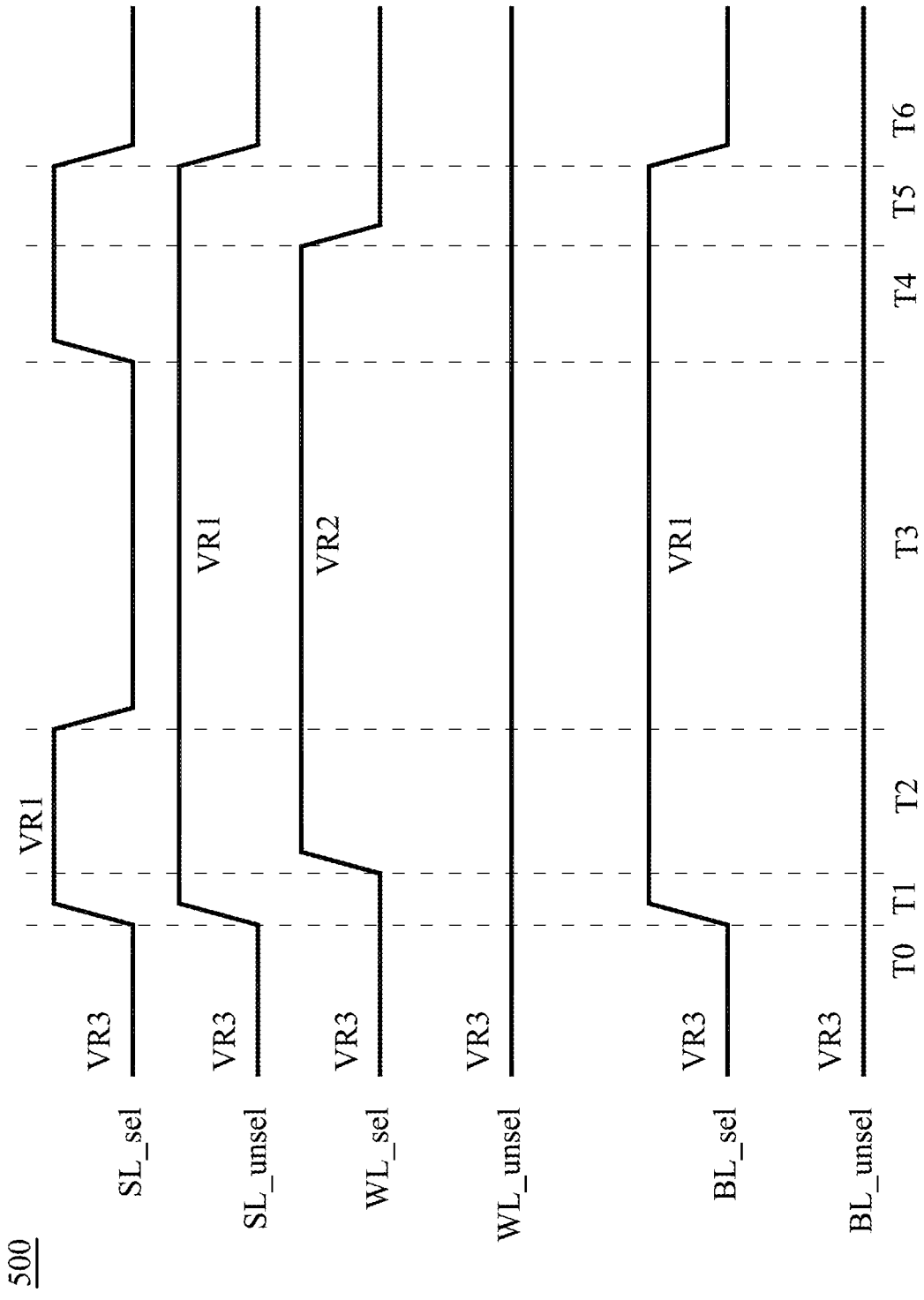

MEMORY DEVICE WITH SOURCE LINE CONTROL

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided, but may lose the stored data once the power is shut off. Unlike volatile memory devices, non-volatile memory devices may retain data even after the power is shut off, but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B illustrates a timing diagram of voltages applied for writing data to the selected memory cell, in accordance with some embodiments.

FIG. 5B illustrates a timing diagram of voltages applied for reading data stored by a selected memory cell, in accordance with some embodiments.

DETAILED DESCRIPTION

Figure 1:
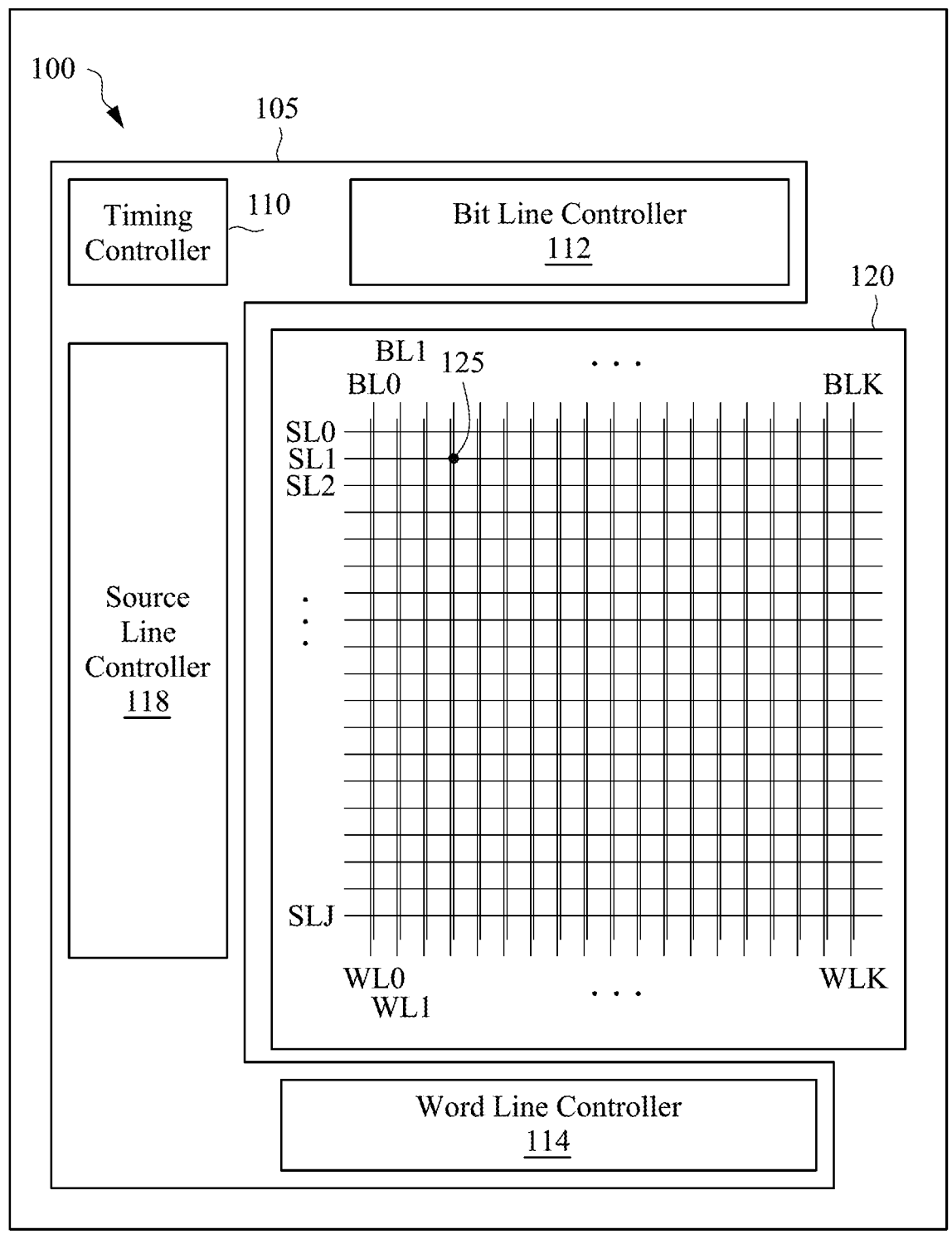
FIG. 1 illustrates a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to a memory device with separately controllable or configurable source lines. In some embodiments, the memory device includes a memory array and a memory controller. The memory array includes an array of memory cells, and bit lines, word lines, and source lines coupled to the array of memory cells. Bit lines and word lines may extend in parallel along a first direction, and source lines may extend in a second direction traversing the first direction. Each memory cell may include a select transistor and a storage element connected in series between a corresponding bit line and a corresponding source line. The storage element may be an e-fuse element, a magnetic tunnel junction (MTJ) cell, a MIM capacitor, or any component that can store data. The select transistor may be metal oxide semiconductor field effect transistor (MOSFET), bipolar junction transistor (BJT), high voltage transistor, high frequency transistor, FinFET, planar MOS transistor with raised source/drains, nanosheet FET, nanowire FET, or the like.

In some embodiments, the memory device includes a memory controller configured to apply various voltages to write data to a selected memory cell. In one aspect, the memory controller applies a first write voltage to a bit line coupled to a selected memory cell of the set of memory cells during a first time period. The memory controller may apply a second write voltage to a word line coupled to a gate electrode of a select transistor of the selected memory cell during the first time period. The memory controller may apply a third write voltage to a source line coupled to the selected memory cell during the first time period. The second write voltage may be between the first write voltage and the third write voltage. In one aspect, a first difference between the first write voltage and the second write voltage may be less than an allowable stress voltage of the select transistor, and a second difference between the second write voltage and the third write voltage may be less than the allowable stress voltage of the select transistor.

Advantageously, the memory device can be implemented in a compact form and may operate in a reliable manner. In one aspect, programming or writing data to a selected memory cell includes applying a high voltage to the bit line and the word line to burn the storage element or change the resistance of the storage element. However, applying the high voltage across the word line and the source line exceeding an allowable stress voltage of the select transistor may damage the select transistor. In one implementation, two or more transistors connected in series can be provided in each memory cell to prevent excessive voltages from being applied across the select transistor. However, such implementation may increase the area of the memory device. In one aspect, each memory cell disclosed herein may include a single select transistor and a single storage element to form a 1T1R or 1T1C configuration to achieve area efficiency, while the second write voltage is applied to the word line such that an excessive voltage may not be applied to the source transistor to protect the source transistor and ensure the reliable operation.

FIG. 1 is a diagram of a memory device 100 (or memory system 100), in accordance with one embodiment. In some embodiments, the memory device 100 includes a memory controller 105 and a memory array 120. The memory array 120 may include a plurality of storage circuits or memory cells 125 arranged in two or three dimensional arrays. Each memory cell 125 may be coupled to a corresponding word line WL, a corresponding bit line BL, and a corresponding source line SL. The memory controller 105 may write data to or read data from the memory array 120 according to electrical signals through word lines WL, bit lines BL, and source lines SL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes source lines SL0, SL1 . . . SLJ, each extending in a first direction (e.g., X-direction), word lines WL0, WL1 . . . WLK, each extending in a second direction (e.g., Y-direction), and bit lines BL0, BL1 . . . BLK, each extending in the second direction. The source lines SL, the word lines WL and the bit lines BL may be conductive metals or conductive rails. In one aspect, each memory cell 125 is coupled to a corresponding word line WL, a corresponding bit line BL, and a corresponding source line SL, and can be operated according to voltages or currents through the corresponding word line WL, the corresponding bit line BL, and the corresponding source line SL. Each memory cell 125 may include a volatile memory, a non-volatile memory, or a combination of them. In some embodiments, the memory array 120 includes additional lines (e.g., reference lines, reference control lines, power rails, etc.).

The memory controller 105 is a hardware component that controls operations of the memory array 120. In some embodiments, the memory controller 105 includes a bit line controller 112, a word line controller 114, a source line controller 118, and a timing controller 110. The bit line controller 112, the word line controller 114, the source line controller 118, and the timing controller 110 may be embodied as logic circuits, analog circuits, or a combination of them. In one configuration, the word line controller 114 is a circuit that provides a voltage or current through one or more word lines WL of the memory array 120. The bit line controller 112 is a circuit that provides or senses a voltage or current through one or more bit lines BL of the memory array 120, and the source line controller 118 is a circuit that provides or senses a voltage or current through one or more source lines SL of the memory array 120. In one configuration, the timing controller 110 is a circuit that provides control signals or clock signals to synchronize operations of the bit line controller 112, the word line controller 114, and the source line controller 118. The bit line controller 112 may be coupled to bit lines BL of the memory array 120, the word line controller 114 may be coupled to word lines WL of the memory array 120, and the source line controller 118 may be coupled to source lines SL of the memory array 120. In some embodiments, the memory controller 105 includes more, fewer, or different components than shown in FIG. 1.

In one aspect, the timing controller 110 determines a selected memory cell 125 from a plurality of memory cells in the memory array 120, and causes the bit line controller 112, the word line controller 114, and the source line controller 118 to apply different voltages to selected lines and unselected lines. A selected line may be a line coupled to a selected memory cell, where an unselected line may be a line not coupled to the selected memory cell. Data can be programmed to the selected memory cell 125 or data stored by the selected memory cell 125 can be accessed by applying specific voltages to a selected bit line, a selected source line, and a selected word line. Detailed descriptions on operations of the bit line controller 112, the word line controller 114, and the source line controller 118 to write data to memory cells 125 and to read data stored by the memory cells 125 are provided below with respect to FIGS. 2-14.

Figure 2:
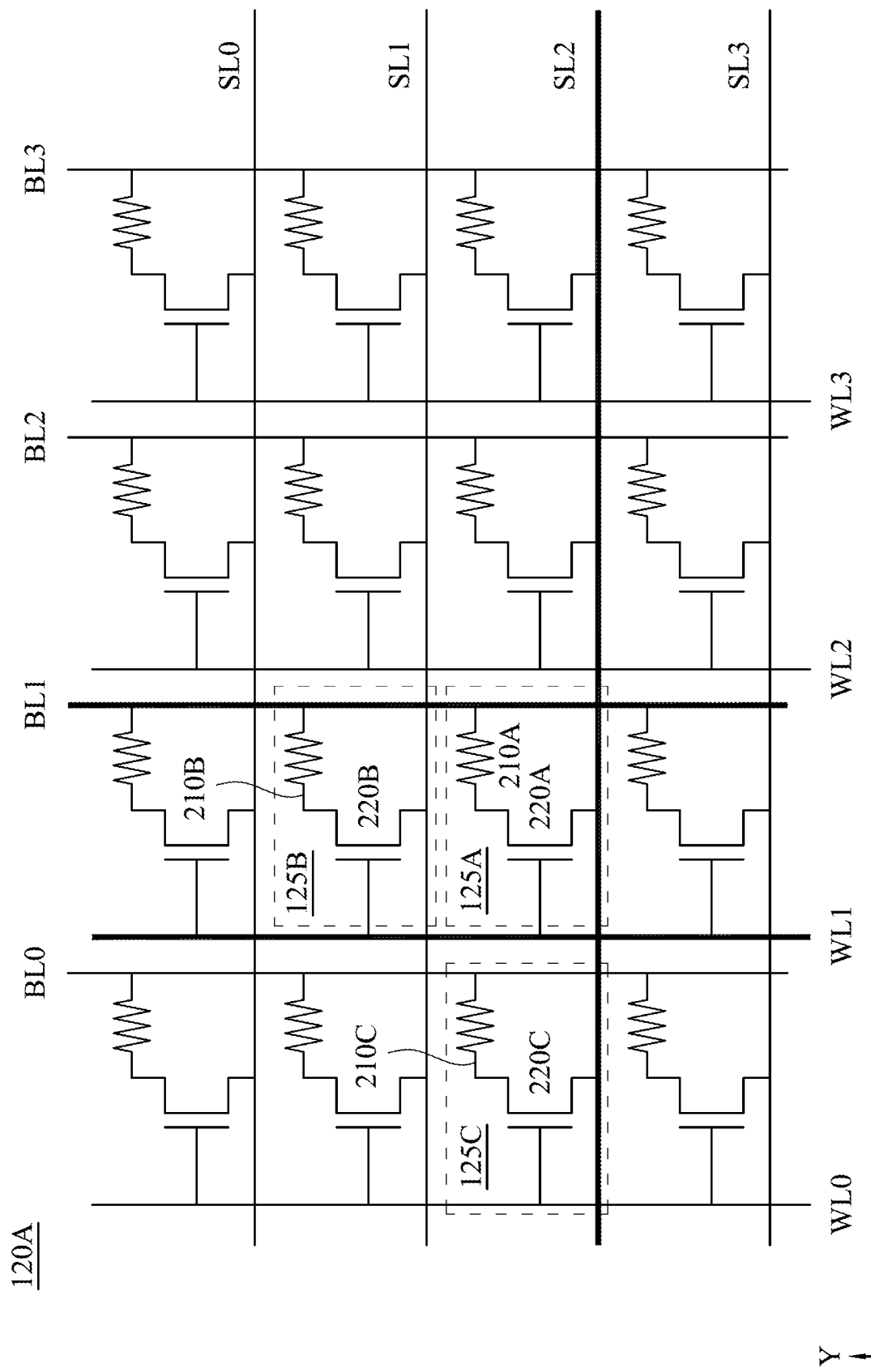
FIG. 2 illustrates a schematic diagram of a memory array, in accordance with some embodiments.

FIG. 2 illustrates a schematic diagram of a memory array 120A, in accordance with some embodiments. The memory array 120A may be a portion of the memory array 120 in FIG. 1. The memory array 120A may include an array of memory cells 125 (e.g., 125A, 125B, 125C). The memory array 120A may also include source lines SL0 . . . SL3 extending along a first direction (e.g., X-direction), bit lines BL0 . . . BL3 extending along a second direction (e.g., Y-direction), and word lines WL0 . . . WL3 extending along the second direction (e.g., Y-direction).

Each memory cell 125 may include a select transistor 220 and a storage element 210 connected in series between a corresponding bit line BL and a corresponding source line SL. The storage element 210 may be an e-fuse element, a MTJ cell, or any programmable resistor. The select transistor 220 may be a N-type transistor (e.g., N-type MOSFET, N-type BJT, N-type FinFET, etc.). In one configuration, one end of the storage element 210 is coupled to a corresponding bit line BL, and another end of the storage element 210 is coupled to a drain electrode of the select transistor 220. In one configuration, a gate electrode of the select transistor 220 is coupled to a corresponding word line WL, and a source electrode of the select transistor 220 is coupled to a corresponding source line SL. In this configuration, the memory cells 125 may have 1T1R to have a small form factor. In some embodiments, the select transistor 220 can be replaced by a component that can perform the functionalities of the select transistor 220 described herein.

Figure 3A:
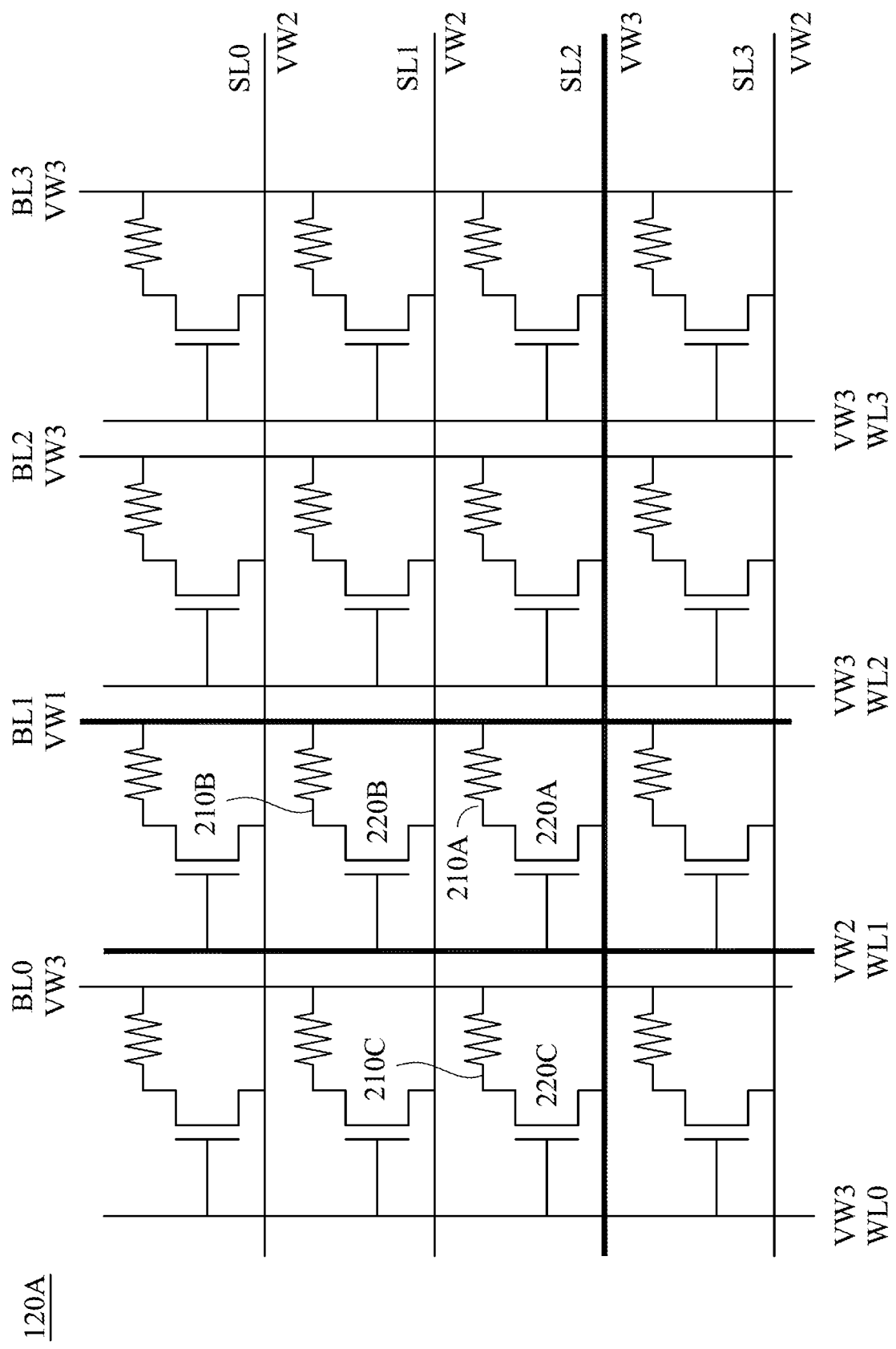
FIG. 3A illustrates example voltages applied to write data to a selected memory cell, in accordance with some embodiments.

FIG. 3A illustrates example voltages applied to the memory array 120A to write data to a selected memory cell (e.g., 125A), in accordance with some embodiments. In one aspect, the memory controller 105 applies write voltages VW1, VW2, VW3 to the source lines SL, bit lines BL, and the word lines WL as shown in FIG. 3A to write data to a selected memory cell 125A including the storage element 210A and the select transistor 220A. In one example, the write voltage VW1 may be a high voltage (e.g., higher than 1.5V) sufficient to burn or change the resistance of the storage element 210. The write voltage VW3 may be a ground voltage (e.g., 0V). The write voltage VW2 may be a voltage (e.g., 0.6~1.0V) between the write voltages VW1, VW3. In one aspect, the difference between the write voltages VW2, VW3 may be larger than a threshold voltage of the select transistor 220, but less than an allowable stress voltage of the select transistor 220. In addition, the difference between the write voltages VW1, VW2 may be less than an allowable stress voltage of the select transistor 220.

In one aspect, the write voltages VW1, VW2, VW3 applied as shown in FIG. 3A allow the selected memory cell 125A to be programmed. For example, the write voltage VW1 is applied to the storage element 210A through the bit line BL1, while the write voltage VW3 is applied to the source electrode of the select transistor 220A through the source line SL2, and the write voltage VW2 is applied to the gate electrode of the select transistor 220A through the word line WL1. Because the voltage difference (e.g., VW2-VW3) larger than a threshold voltage can be applied between the gate electrode and the source electrode of the select transistor 220A, the select transistor 220A can be enabled, such that a large voltage difference (e.g., VW1-VW3) can be applied across the storage element 210A. By applying the large voltage difference (e.g., VW1-VW3) across the storage element 210A, the storage element 210A can be burned and programmed accordingly.

Meanwhile, the write voltages VW1, VW2, VW3 applied as shown in FIG. 3A can prevent the unselected memory cell 125B coupled to the selected word line WL1 and coupled to unselected source line SL1 from being programmed, while the selected memory cell 125A is programmed. For example, the write voltage VW1 is applied to the storage element 210B through the bit line BL1, while the write voltage VW2 is applied to the source electrode of the select transistor 220B through the source line SL1, and the write voltage VW2 is applied to the gate electrode of the select transistor 220B through the word line WL1. Because the voltage difference (e.g., 0V or VW2-VW2) less than the threshold voltage can be applied between the gate electrode and the source electrode of the select transistor 220B, the select transistor 220B can be disabled to prevent the storage element 210B from being programmed.

Similarly, the write voltages VW1, VW2, VW3 applied as shown in FIG. 3A can prevent the unselected memory cell 125C coupled to the selected source line SL2 and coupled to unselected word line WL0 from being programmed, while the selected memory cell 125A is programmed. For example, the write voltage VW3 is applied to the storage element 210C through the bit line BL0, while the write voltage VW3 is applied to the source electrode of the select transistor 220C through the source line SL2, and the write voltage VW3 is applied to the gate electrode of the select transistor 220C through the word line WL0. Because the voltage difference (e.g., 0V or VW3-VW3) less than the threshold voltage can be applied between the gate electrode and the source electrode of the select transistor 220C, the select transistor 220C can be disabled to prevent the storage element 210C from being programmed.

FIG. 3B illustrates a timing diagram 300 of voltages applied for writing data to the selected memory cell 125A, in accordance with some embodiments. In one approach, the memory controller 105 applies different voltage waveforms in different phases as shown in FIG. 3B to write data to the selected memory cell 125A. For example, the memory controller 105 may apply the voltage waveform SL_sel to the selected source line (e.g., SL2) coupled to the selected memory cell (e.g., 125A), and apply the voltage waveform SL_unsel to unselected source lines (e.g., SL0, SL1, SL3). For example, the memory controller 105 may apply the voltage waveform WL_sel to the selected word line (e.g., WL1) coupled to the selected memory cell (e.g., 125A), and apply the voltage waveform WL_unsel to unselected word lines (e.g., WL0, WL2, WL3). For example, the memory controller 105 may apply the voltage waveform BL_sel to the selected bit line (e.g., BL1) coupled to the selected memory cell (e.g., 125A), and apply the voltage waveform BL_unsel to unselected bit lines (e.g., BL0, BL2, BL3).

In one example, during a time period T0, the write voltage VW3 (e.g., ground voltage) can be applied to the bit lines BL, the source lines SL, and the word lines WL. By applying the write voltage VW3 (e.g., 0V) to the bit lines BL, the source lines SL, and the word lines WL, the memory cells 125 may not be programmed.

During a time period T1, the write voltage VW2 (e.g., 0.6~1.0V) can be applied to the source lines (e.g., SL0-SL3). Meanwhile, the write voltage VW2 can be applied to the selected bit line (e.g., BL1) coupled to the selected memory cell 125A, and the write voltage VW3 can be applied to the unselected bit lines (e.g., BL0, BL2, BL3). In addition, the write voltage VW3 can be applied to the word lines (e.g., WL0-WL3). Because the voltage difference (e.g., -VW2 or VW3-VW2) less than the threshold voltage can be applied between the gate electrodes and the source electrodes of the select transistors 220 of the memory cells, the select transistors 220 of the memory cells 125 can be disabled and the memory cells 125 may not be programmed.

During a time period T2, the write voltage VW2 (e.g., 0.6~1.0V) can be applied to the source lines (e.g., SL0-SL3). In addition, the write voltage VW2 can be applied to the selected bit line (e.g., BL1) coupled to the selected memory cell 125A, and the write voltage VW3 can be applied to the unselected bit lines (e.g., BL0, BL2, BL3). During the time period T2, the write voltage VW2 (e.g., 0.6~1.0V) is applied to the selected word line (e.g., WL1) coupled to the selected memory cell (e.g., 125A), while the write voltage VW3 (e.g., 0V) is applied to the unselected word lines (e.g., WL0, WL2, WL3). Even though the write voltage VW2 is applied to the selected word line (e.g., WL1) coupled to the selected memory cell (e.g., 125A) during the time period T2, the voltage difference (e.g., 0V or VW2-VW2) less than the threshold voltage can be applied between the gate electrodes and the source electrodes of select transistors (e.g., 220A, 220B) coupled to the selected word line (e.g., WL1), such that the select transistors (e.g., 220A, 220B) coupled to the selected word line (e.g., WL1) can be disabled and memory cells 125 coupled to the selected word line (e.g., WL1) may not be programmed.

During a time period T3, the write voltage VW2 (e.g., 0.6~1.0V) can be applied to the source lines (e.g., SL0-SL3). In addition, the write voltage VW1 (e.g., higher than 1.5V) can be applied to the selected bit line (e.g., BL1) coupled to the selected memory cell 125A, and the write voltage VW3 can be applied to the unselected bit lines (e.g., BL0, BL2, BL3). During the time period T3, the write voltage VW2 (e.g., 0.6~1.0V) is applied to the selected word line (e.g., WL1) coupled to the selected memory cell (e.g., 125A), while the write voltage VW3 (e.g., 0V) is applied to the unselected word lines (e.g., WL0, WL2, WL3). Again, even though the write voltage VW2 is applied to the selected word line (e.g., WL1) coupled to the selected memory cell (e.g., 125A) during the time period T3, because the voltage difference (e.g., 0V or VW2-VW2) less than the threshold voltage can be applied between the gate electrodes and the source electrodes of select transistors (e.g., 220A, 220B) coupled to the selected word line (e.g., WL1), the select transistors (e.g., 220A, 220B) coupled to the selected word line (e.g., WL1) can be disabled and memory cells 125 coupled to the selected word line (e.g., WL1) may not be programmed.

During a time period T4, the write voltage VW3 (e.g., 0V) can be applied to the selected source line (e.g., SL2) coupled to the selected memory cell (e.g., 125A) while the write voltage VW2 (e.g., 0.6~1.0V) is applied to unselected source lines (e.g., SL0, SL1, SL3). In addition, the write voltage VW1 (e.g., higher than 1.5V) can be applied to the selected bit line (e.g., BL1) coupled to the selected memory cell 125A, and the write voltage VW3 can be applied to the unselected bit lines (e.g., BL0, BL2, BL3). During the time period T4, the write voltage VW2 (e.g., 0.6~1.0V) is applied to the selected word line (e.g., WL1) coupled to the selected memory cell (e.g., 125A), while the write voltage VW3 (e.g., 0V) is applied to the unselected word lines (e.g., WL0, WL2, WL3). During the time period T4, because the voltage difference (e.g., VW2 or VW2-VW3) larger than the threshold voltage can be applied between the gate electrode and the source electrode of select transistor (e.g., 220A) of the selected memory cell (e.g., 125A) coupled to the selected word line (e.g., WL1) and the selected source line (e.g., SL2), the select transistor (e.g., 220A) of the selected memory cell (e.g., 125A) can be enabled. By enabling the select transistor (e.g., 220A) of the selected memory cell (e.g., 125A), high voltage (e.g., VW1-VW3) can be applied across the storage element (e.g., 210A) of the selected memory cell (e.g., 125A) to program data. Meanwhile, during the time period T4, because the voltage difference (e.g., 0V or VW2-VW2) less than the threshold voltage can be applied between the gate electrodes and the source electrodes of select transistors (e.g., 220B) of unselected memory cells 125 coupled to the selected word line (e.g., WL1) and unselected source lines (e.g., SL0, SL1, SL3), the select transistors (e.g., 220B) coupled to the selected word line (e.g., WL1) and unselected source lines (e.g., SL0, SL1, SL3) can be disabled to prevent the unselected memory cells 125 coupled to the selected word line (e.g., WL1) and unselected source lines (e.g., SL0, SL1, SL3) from being programmed. In addition, during the time period T4, because the voltage difference (e.g., 0V or VW3-VW3) less than the threshold voltage can be applied between the gate electrodes and the source electrodes of select transistors (e.g., 220C) of unselected memory cells 125 coupled to the selected source line (e.g., SL2) and unselected word lines (e.g., WL0, WL2, WL3), the select transistors (e.g., 220C) coupled to the selected source line (e.g., SL2) and unselected word lines (e.g., WL0, WL2, WL3) can be disabled to prevent the unselected memory cells 125 coupled to the selected source line (e.g., SL2) and unselected word lines (e.g., WL0, WL2, WL3) from being programmed.

In one aspect, a transition period (e.g., T1, T2, T3) is shorter than a programming time period (e.g., T4). For example, the transition time period (e.g., T1, T2, T3) may be 0.1 ns-5 ns to ensure enough time for bit lines BL, word lines WL, source lines SL to charge or discharge to steady state voltages to avoid un-wanted current flowing through memory cell 125 during transition. Meanwhile, the programming time period (e.g., T4) may be 1 us~10 us to allow sufficient current to flow through the memory cell 125 and ensure correct programming.

After programming the selected memory cell (e.g., 125A), the memory controller 105 may apply voltages during the time periods T5, T6, T7, T8, as voltages applied during the time periods T3, T2, T1, T0, respectively. For example, during the time period T5, the memory controller 105 applies voltages to the source lines SL, the word lines WL, and the bit lines BL, as the voltages applied during the time period T3. For example, during the time period T6, the memory controller 105 applies voltages to the source lines SL, the word lines WL, and the bit lines BL, as the voltages applied during the time period T2. For example, during the time period T7, the memory controller 105 applies voltages to the source lines SL, the word lines WL, and the bit lines BL as the voltages applied during the time period T1. For example, during the time period T8, the memory controller 105 applies voltages to the source lines SL, the word lines WL, and the bit lines BL, as the voltages applied during the time period T0. Thus, detailed descriptions of duplicated portion thereof are omitted herein for the sake of brevity.

Advantageously, the memory array 120A may be programmed and operate in a reliable manner. In one aspect, the difference between the write voltages VW2, VW3 may be larger than a threshold voltage of the select transistor 220, but less than an allowable stress voltage of the select transistor 220. In addition, the difference between the write voltages VW1, VW2 may be less than an allowable stress voltage of the select transistor 220. Accordingly, no excessive voltage may be applied to the select transistors 220 during programming, such that the memory cells 125 may be programmed without damaging the select transistors 220.

Figure 4A:
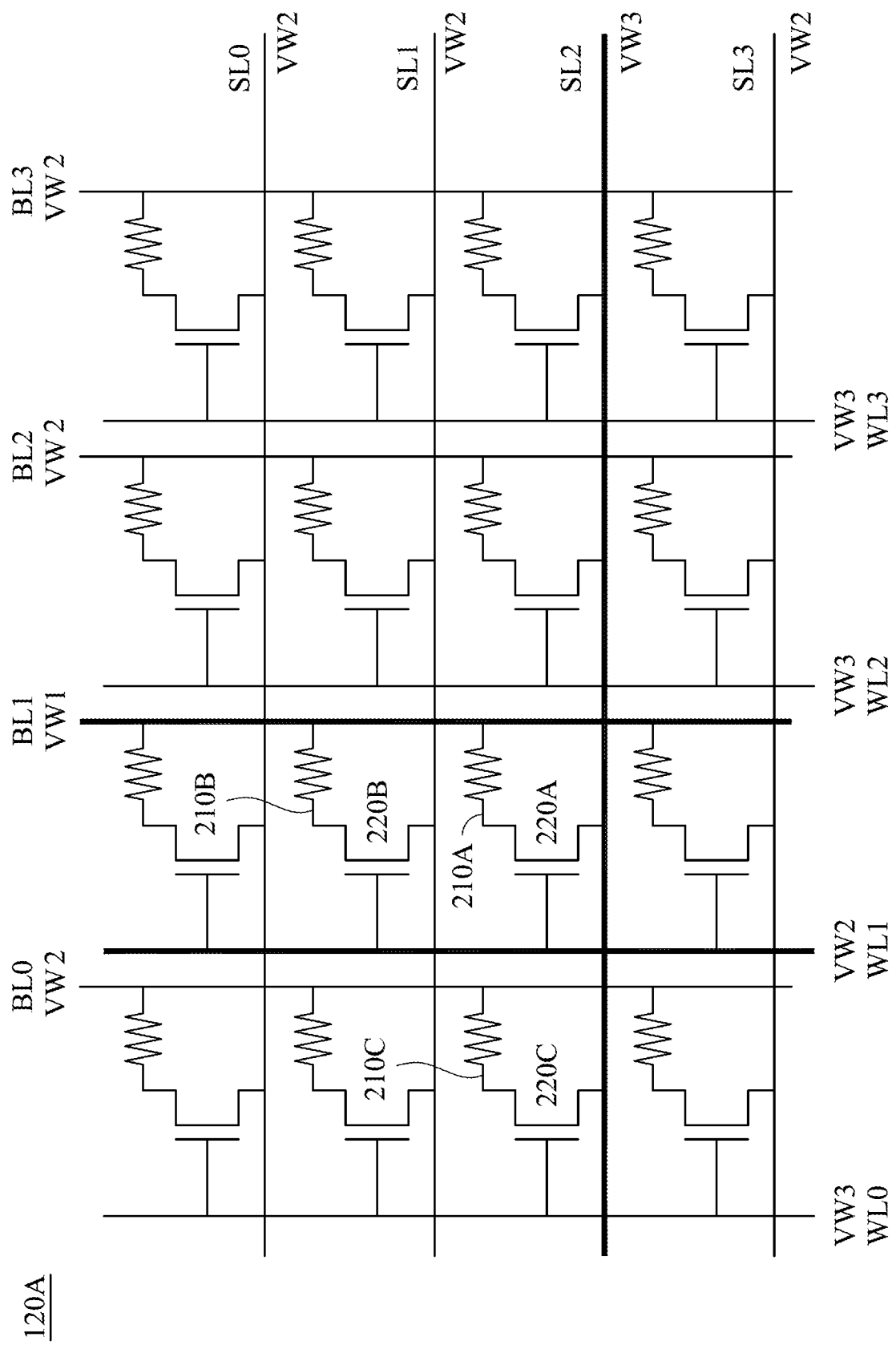
FIG. 4A illustrates example voltages applied to write data to a selected memory cell, in accordance with some embodiments.

FIG. 4A illustrates example voltages applied to the memory array 120A to write data to a selected memory cell (e.g., 125A), in accordance with some embodiments. The voltages applied in FIG. 4A are similar to the voltages applied in FIG. 3A, except the write voltage VW2 is applied to the unselected bit lines (e.g., BL0, BL2, BL3). Thus, detailed descriptions of duplicated portion thereof are omitted herein for the sake of brevity. In one aspect, applying the write voltage VW2 to the unselected bit lines BL (e.g., BL0, BL2, BL3) can ensure that no voltage stress is applied to memory cells 125 coupled to the unselected bit lines BL (e.g., BL0, BL2, BL3).

Figure 4B:
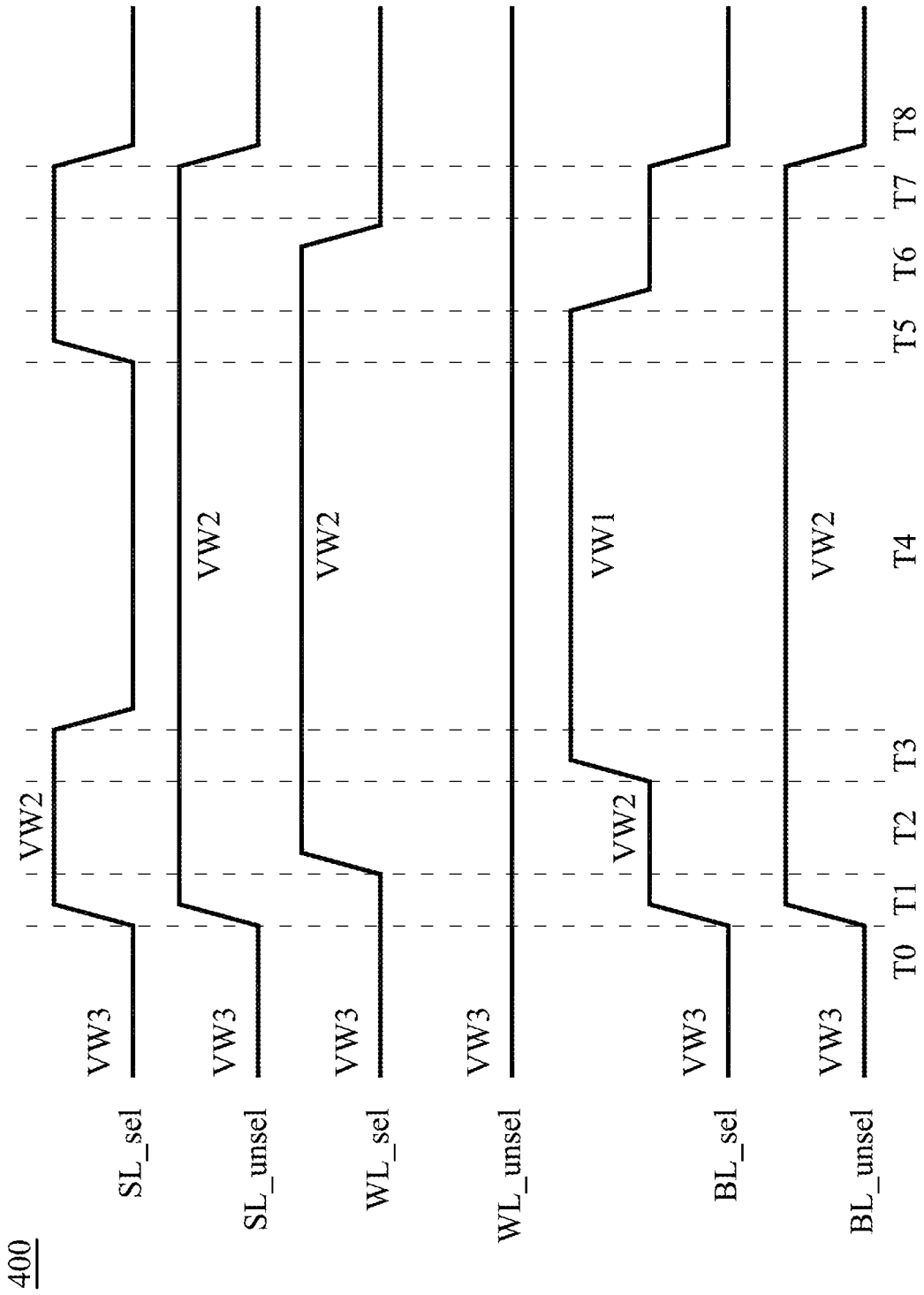
FIG. 4B illustrates a timing diagram of voltages applied for writing data to the selected memory cell, in accordance with some embodiments.

FIG. 4B illustrates a timing diagram 400 of voltages applied for writing data to the selected memory cell (e.g., 125A), in accordance with some embodiments. The timing diagram 400 is similar to the timing diagram 300 except, the write voltage VW2 is applied to unselected bit lines BL (e.g., BL0, BL2, BL3) during the time periods T1-T7. By applying the write voltage VW2 to the unselected bit lines BL (e.g., BL0, BL2, BL3), no voltage stress can be applied to memory cells 125 coupled to the unselected bit lines BL (e.g., BL0, BL2, BL3).

Figure 5A:
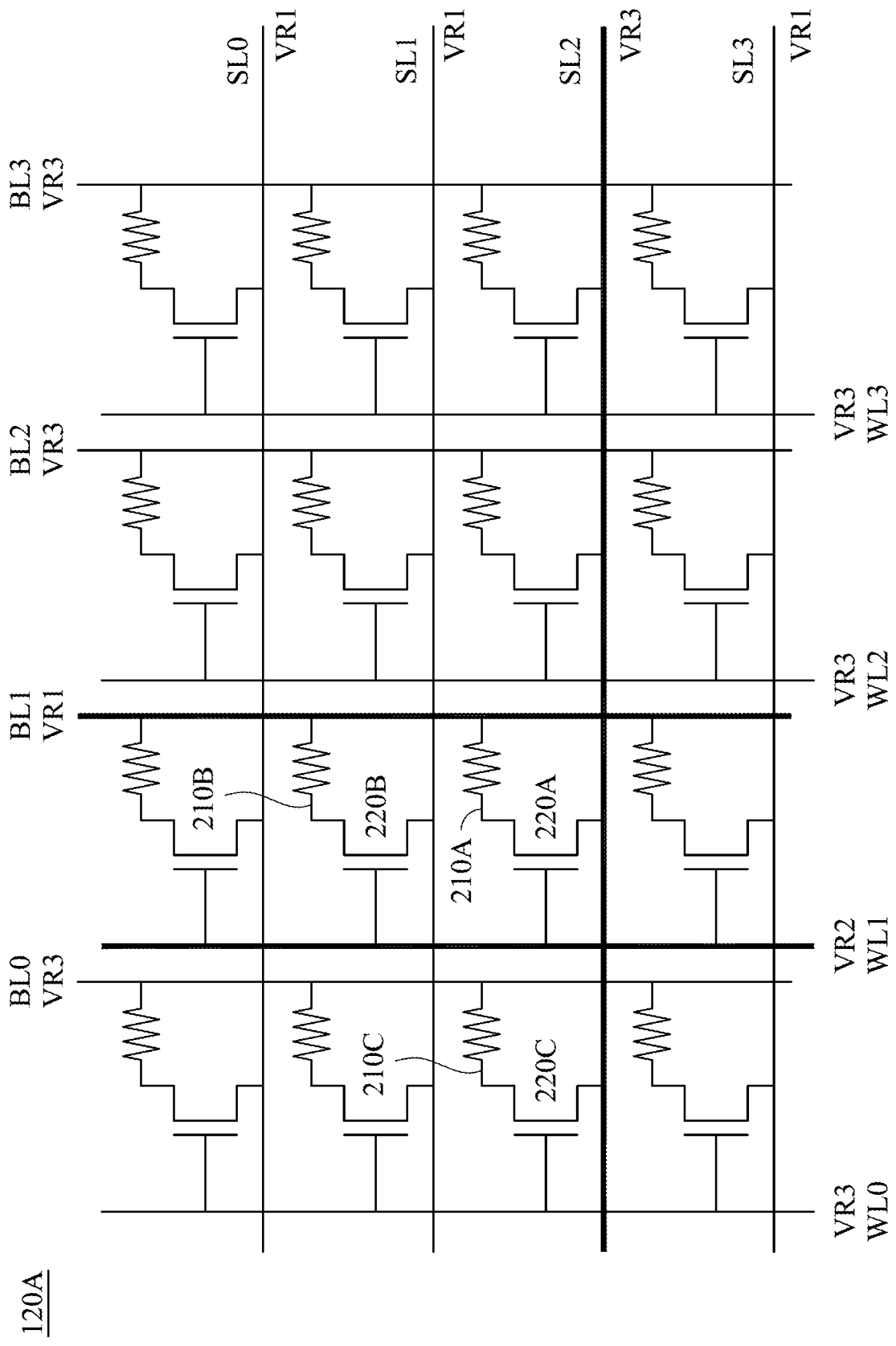
FIG. 5A illustrates example voltages applied to read data stored by a selected memory cell, in accordance with some embodiments.

FIG. 5A illustrates example voltages applied to the memory array 120A to read data stored by a selected memory cell 125A, in accordance with some embodiments. In one aspect, the memory controller 105 applies read voltages VR1, VR2, VR3 to the source lines SL, bit lines BL, and the word lines WL as shown in FIG. 5A to read data stored by a selected memory cell 125A including the storage element 210A and the select transistor 220A. In one example, the read voltage VR1 may be a voltage (e.g., 0.3V~0.7V) to allow current flow through the selected memory cell (e.g., 125A). The read voltage VR3 may be a ground voltage (e.g., 0V). The read voltage VR2 may be a voltage (e.g., 0.6~1.0V) larger than a threshold voltage of the select transistor 220. The read voltage VR2 may be larger than the read voltage VR1.

In one aspect, the read voltages VR1, VR2, VR3 applied as shown in FIG. 5A allow the selected memory cell 125A to conduct current. For example, the read voltage VR1 is applied to the storage element 210A through the bit line BL1, while the read voltage VR3 is applied to the source electrode of the select transistor 220A through the source line SL2, and the read voltage VR2 is applied to the gate electrode of the select transistor 220A through the word line WL1. Because the voltage difference (e.g., VR2-VR3) larger than the threshold voltage can be applied between the gate electrode and the source electrode of the select transistor 220A, the select transistor 220A can be enabled and conduct current according to the programmed state of the storage element 210A. For example, if the storage element 210A is burned or programmed, then no current may flow through the select transistor 220A. For example, if the storage element 210A is not burned or not programmed, then current may flow through the select transistor 220A. The bit line controller 112 may sense current through the selected bit line BL coupled to the selected memory cell 125 or the source line controller 118 may sense current through the selected source line SL coupled to the selected memory cell 125 to determine the programmed state of the selected memory cell 125 according to the sensed current.

Meanwhile, the read voltages VR1, VR2, VR3 applied as shown in FIG. 5A can prevent the unselected memory cell 125B coupled to the selected word line WL1 and unselected source line SL1 from conducting current, while the selected memory cell 125A may conduct current according to the programmed state. For example, the read voltage VR1 is applied to the storage element 210B through the bit line BL1, while the read voltage VR1 is applied to the source electrode of the select transistor 220B through the source line SL1, and the read voltage VR2 is applied to the gate electrode of the select transistor 220B through the word line WL1. Because the source electrode of the select transistor 220B and the storage element 210B have the same voltage, no current may flow through the select transistor 220B and the storage element 210B regardless of whether the select transistor 220B is enabled or not.

Similarly, the read voltages VR1, VR2, VR3 applied as shown in FIG. 5A can prevent the unselected memory cell 125C coupled to the selected source line SL2 and unselected word line WL0 from conducting current, while the selected memory cell 125A may conduct current according to the programmed state. For example, the read voltage VR3 is applied to the storage element 210C through the bit line BL0, while the read voltage VR3 is applied to the source electrode of the select transistor 220C through the source line SL2, and the read voltage VR3 is applied to the gate electrode of the select transistor 220C through the word line WL0. Because the voltage difference (e.g., 0V) less than the threshold voltage can be applied between the gate electrode and the source electrode of the select transistor 220C, the select transistor 220C can be disabled and may not conduct current. Even if the select transistor 220C is enabled, the source electrode of the select transistor 220C and the storage element 210C have the same voltage, such that no current may flow through the select transistor 220C and the storage element 210C.

FIG. 5B illustrates a timing diagram 500 of voltages applied for reading data stored by a selected memory cell (e.g., 125A), in accordance with some embodiments. In one approach, the memory controller 105 applies different voltage waveforms in different phases as shown in FIG. 5B to read data stored by the selected memory cell 125A. For example, the memory controller 105 may apply the voltage waveform SL_sel to the selected source line (e.g., SL2) coupled to the selected memory cell (e.g., 125A), and apply the voltage waveform SL_unsel to unselected source lines (e.g., SL0, SL1, SL3). For example, the memory controller 105 may apply the voltage waveform WL_sel to the selected word line (e.g., WL1) coupled to the selected memory cell (e.g., 125A), and apply the voltage waveform WL_unsel to unselected word lines (e.g., WL0, WL2, WL3). For example, the memory controller 105 may apply the voltage waveform BL_sel to the selected bit line (e.g., BL1) coupled to the selected memory cell (e.g., 125A), and apply the voltage waveform BL_unsel to unselected bit lines (e.g., BL0, BL2, BL3).

In one example, during a time period T0, the read voltage VR3 (e.g., ground voltage) can be applied to the bit lines BL, the source lines SL, and the word lines WL. By applying the read voltage VR3 (e.g., 0V) to the bit lines BL, the source lines SL, and the word lines WL, the memory cells 125 may not conduct current.

During a time period T1, the read voltage VR1 (e.g., 0.3~1.0V) can be applied to the source lines (e.g., SL0-SL3). Meanwhile, the read voltage VR1 can be applied to the selected bit line (e.g., BL1) coupled to the selected memory cell 125A, and the read voltage VR3 can be applied to the unselected bit lines (e.g., BL0, BL2, BL3). In addition, the read voltage VR3 can be applied to the word lines (e.g., WL0-WL3). Because the voltage difference (e.g., -VR1 or VR3-VR1) less than the threshold voltage can be applied between the gate electrode and the source electrode of the select transistors 220, the select transistors 220 can be disabled and the memory cells 125 may not conduct current.

During a time period T2, the read voltage VR1 (e.g., 0.3~1.0V) can be applied to the source lines (e.g., SL0-SL3). In addition, the read voltage VR1 can be applied to the selected bit line (e.g., BL1) coupled to the selected memory cell 125A, and the read voltage VR3 can be applied to the unselected bit lines (e.g., BL0, BL2, BL3). During the time period T2, the read voltage VR2 (e.g., 0.6~1.0V) is applied to the selected word line (e.g., WL1) coupled to the selected memory cell (e.g., 125A), while the read voltage VR3 (e.g., 0V) is applied to the unselected word lines (e.g., WL0, WL2, WL3). Even though the read voltage VR2 is applied to the selected word line (e.g., WL1) during the time period T2, the source electrodes of the select transistors (e.g., 220A, 220B)

and the storage elements (e.g., 210A, 210B) coupled to the selected word line WL may have the same voltage, such that no current may flow through the select transistors (e.g., 220A, 220B) and the storage elements (e.g., 210A, 210B) coupled to the selected word line WL.

During a time period T3, the read voltage VR3 (e.g., 0V) can be applied to the selected source line (e.g., SL2) coupled to the selected memory cell (e.g., 125A) while the read voltage VR1 (e.g., 0.3~1.0V) is applied to unselected source lines (e.g., SL0, SL1, SL3). In addition, the read voltage VR1 can be applied to the selected bit line (e.g., BL1) coupled to the selected memory cell 125A, and the read voltage VR3 can be applied to the unselected bit lines (e.g., BL0, BL2, BL3). During the time period T3, the read voltage VR2 (e.g., 0.6~1.0V) is applied to the selected word line (e.g., WL1) coupled to the selected memory cell (e.g., 125A), while the read voltage VR3 (e.g., 0V) is applied to the unselected word lines (e.g., WL0, WL2, WL3). During the time period T3, because the voltage difference (e.g., VR2 or VR2-VR3) larger than the threshold voltage can be applied between the gate electrode and the source electrode of select transistor (e.g., 220A) of the selected memory cell (e.g., 125A) coupled to the selected word line (e.g., WL1) and the selected source line (e.g., SL2), the select transistor (e.g., 220A) of the selected memory cell (e.g., 125A) can be enabled. By enabling the select transistor (e.g., 220A) of the selected memory cell (e.g., 125A), current may flow through the select transistor (e.g., 220A) and the storage element (e.g., 210A) of the selected memory cell (e.g., 125A), according to the programmed state of the storage element 210A. Meanwhile, during the time period T3, because source electrodes of the select transistors (e.g., 220B) and storage elements (e.g., 210B) of unselected memory cells (e.g., 125B) coupled to the selected word line (e.g., WL1) and unselected source lines (e.g., SL0, SL1, SL3) have the same voltage, current may not flow through the unselected memory cells 125 coupled to the selected word line WL and unselected source lines SL. In addition, during the time period T3, because the voltage difference (e.g., 0V or VR3-VR3) less than the threshold voltage can be applied between the gate electrodes and the source electrodes of select transistors (e.g., 220C) of unselected memory cells (e.g., 125C) coupled to the selected source line (e.g., SL2) and unselected word lines (e.g., WL0, WL2, WL3), the unselected memory cells 125 coupled to the selected source line (e.g., SL2) and unselected word lines (e.g., WL0, WL2, WL3) may not conduct current. Hence, programmed state of the selected memory cell 125A may be determined by sensing current through the selected bit line (e.g., BL1) or selected source line (e.g., SL2) coupled to the selected memory cell 125A.

In one aspect, a transition period (e.g., T1, T2) is shorter than a reading time period (e.g., T3). For example, the transition time period (e.g., T1, T2) may be 0.1 ns-5 ns to ensure enough time for bit lines BL, word lines WL, source lines SL to charge or discharge to steady state voltages to avoid un-wanted current flowing through the memory cell 125 during transition. Meanwhile, the reading time period (e.g., T3) may be 1 us~10 us to allow sufficient current to flow through the memory cell 125 and ensure correct reading.

After reading data stored by the selected memory cell (e.g., 125A), the memory controller 105 may apply voltages during the time periods T4, T5, T6, as in the time periods T2, T1, T0, respectively. For example, during the time period T4, the memory controller 105 applies voltages to the source lines SL, the word lines WL, and the bit lines BL as the voltages applied during the time period T2. For example, during the time period T5, the memory controller 105 applies voltages to the source lines SL, the word lines WL, and the bit lines BL as the voltages applied during the time period T1. For example, during the time period T6, the memory controller 105 applies voltages to the source lines SL, the word lines WL, and the bit lines BL as the voltages applied during the time period TO. Thus, detailed descriptions of duplicated portion thereof are omitted herein for the sake of brevity.

Figure 6A:
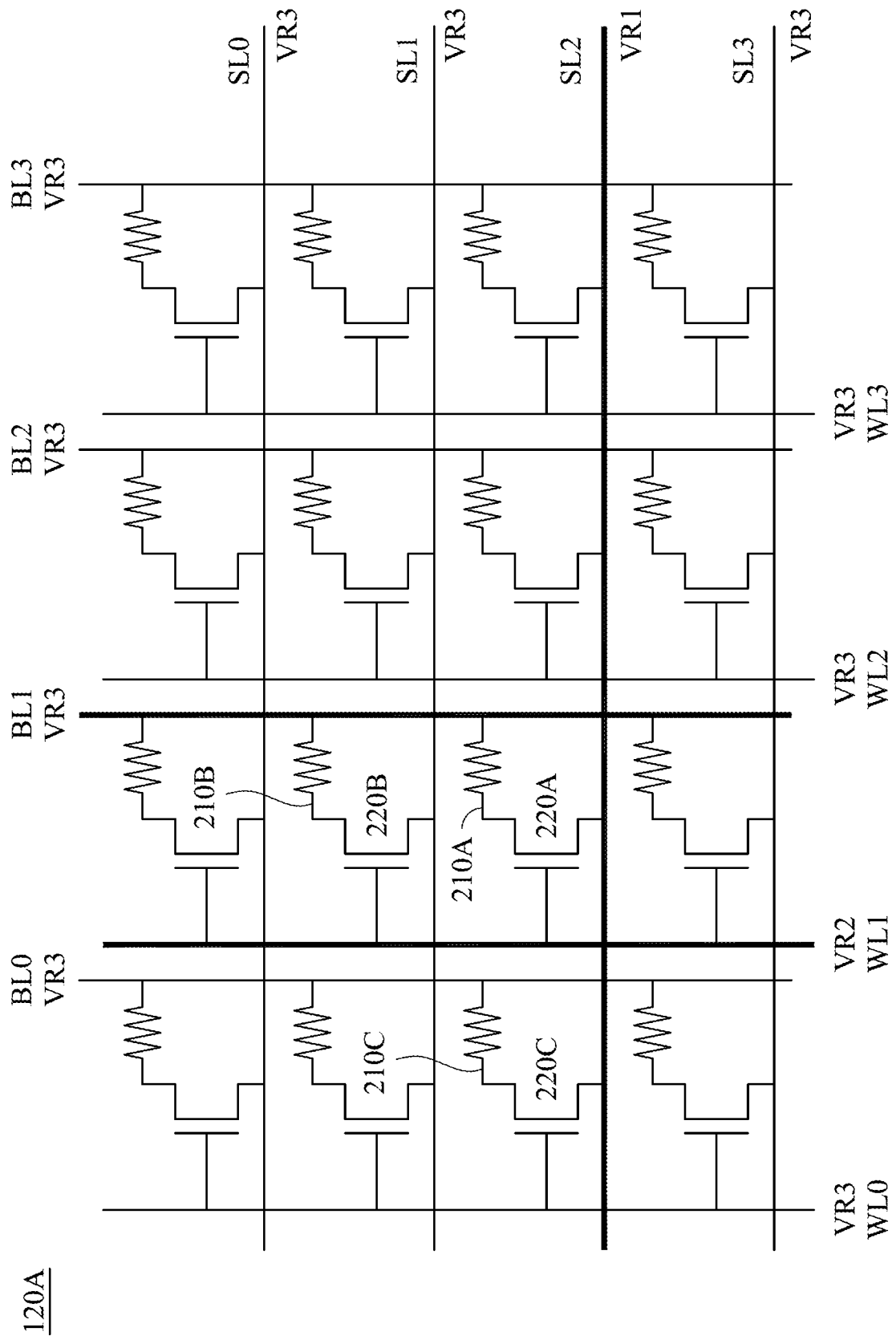
FIG. 6A illustrates example voltages applied to read data stored by a selected memory cell, in accordance with some embodiments.

FIG. 6A illustrates example voltages applied to read data stored by a selected memory cell, in accordance with some embodiments. In one aspect, the memory controller 105 applies read voltages VR1, VR2, VR3 to the source lines SL, bit lines BL, and the word lines WL as shown in FIG. 6A to read data stored by a selected memory cell 125A including the storage element 210A and the select transistor 220A. In one example, the read voltage VR1 may be a voltage (e.g., 0.3V~0.7V) to allow current flow through the selected memory cell (e.g., 125A). The read voltage VR3 may be a ground voltage (e.g., 0V). The read voltage VR2 may be a voltage (e.g., 0.6~1.0V) larger than a threshold voltage of the select transistor 220. The read voltage VR2 may be larger than the read voltage VR1.

In one aspect, the read voltages VR1, VR2, VR3 applied as shown in FIG. 6A allow the selected memory cell 125A to conduct current. For example, the read voltage VR3 is applied to the storage element 210A through the bit line BL1, while the read voltage VR1 is applied to the drain electrode of the select transistor 220A through the source line SL2, and the read voltage VR2 is applied to the gate electrode of the select transistor 220A through the word line WL1. Because the voltage difference (e.g., VR2-VR3) larger than the threshold voltage can be applied between the gate electrode and the source electrode of the select transistor 220A, the select transistor 220A can be enabled and conduct current according to the programmed state of the storage element 210A. For example, if the storage element 210A is burned or programmed, then no current may flow through the select transistor 220A. For example, if the storage element 210A is not burned or not programmed, then current may flow through the select transistor 220A. The bit line controller 112 may sense current through the selected bit line BL coupled to the selected memory cell 125 or the source line controller 118 may sense current through the selected source line SL coupled to the selected memory cell 125 to determine the programmed state of the selected memory cell 125.

Meanwhile, the read voltages VR1, VR2, VR3 applied as shown in FIG. 6A can prevent the unselected memory cell 125B coupled to the selected word line WL1 and unselected source line SL1 from conducting current, while the selected memory cell 125A may conduct current according to the programmed state. For example, the read voltage VR3 is applied to the storage element 210B through the bit line BL1, while the read voltage VR3 is applied to the drain electrode of the select transistor 220B through the source line SL1, and the read voltage VR2 is applied to the gate electrode of the select transistor 220B through the word line WL1. Because the drain electrode of the select transistor 220B and the storage element 210B have the same voltage, no current may flow through the select transistor 220B and the storage element 210B regardless of whether the select transistor 220B is enabled or not.

Similarly, the read voltages VR1, VR2, VR3 applied as shown in FIG. 6A can prevent the unselected memory cell 125C coupled to the selected source line SL2 and unselected word line WL0 from conducting current, while the selected memory cell 125A may conduct current according to the programmed state. For example, the read voltage VR3 is applied to the storage element 210C through the bit line BL0, while the read voltage VR1 is applied to the drain electrode of the select transistor 220C through the source line SL2, and the read voltage VR3 is applied to the gate electrode of the select transistor 220C through the word line WL0. Because the voltage difference (e.g., 0V) less than the threshold voltage can be applied between the gate electrode and the source electrode of the select transistor 220C, the select transistor 220C can be disabled and may not conduct current.

In one aspect, voltages applied in FIG. 6A can be simplified compared to voltages applied as shown in FIG. 5A. For example, the read voltage VR3 is applied to the bit lines BL0-BL3, unselected source lines SL0, SL1, SL3, and unselected word lines WL0, WL2, WL3, when the read voltage VR2 is applied to the selected word line WL1 and the read voltage VR1 is applied to the selected source line SL2. However, unlike in FIG. 5A, current may flow in a reverse direction from the source line SL to the bit line BL in FIG. 6A.

Figure 6B:
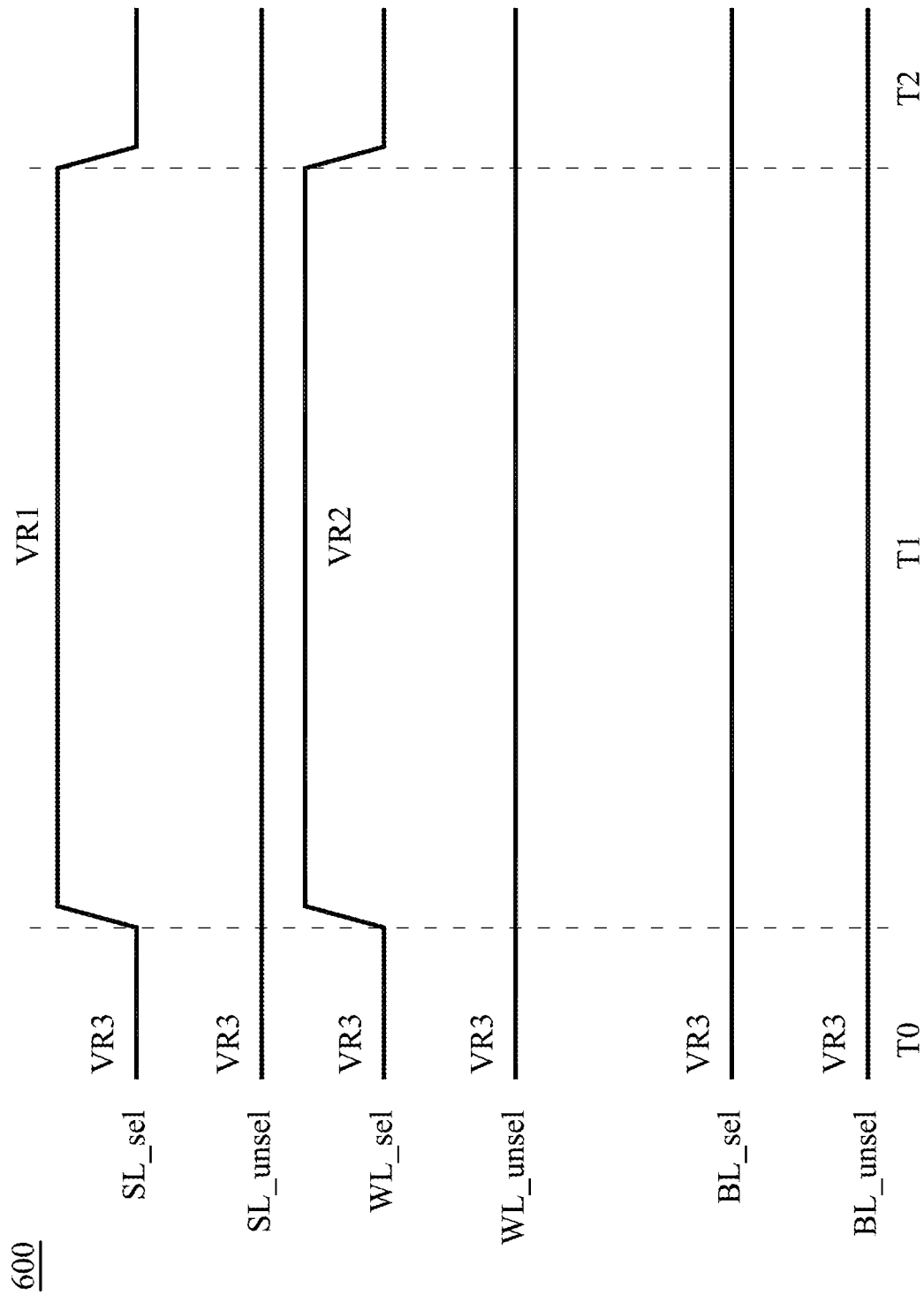
FIG. 6B illustrates a timing diagram of voltages applied for reading data stored by a selected memory cell, in accordance with some embodiments.

FIG. 6B illustrates a timing diagram 600 of voltages applied for reading data stored by a selected memory cell (e.g., 125A), in accordance with some embodiments. In one approach, the memory controller 105 applies different voltage waveforms in different phases as shown in FIG. 6B to read data stored by the selected memory cell 125A. For example, the memory controller 105 may apply the voltage waveform SL_sel to the selected source line (e.g., SL2) coupled to the selected memory cell (e.g., 125A), and apply the voltage waveform SL_unsel to unselected source lines (e.g., SL0, SL1, SL3). For example, the memory controller 105 may apply the voltage waveform WL_sel to the selected word line (e.g., WL1) coupled to the selected memory cell (e.g., 125A), and apply the voltage waveform WL_unsel to unselected word lines (e.g., WL0, WL2, WL3). For example, the memory controller 105 may apply the voltage waveform BL_sel to the selected bit line (e.g., BL1) coupled to the selected memory cell (e.g., 125A), and apply the voltage waveform BL_unsel to unselected bit lines (e.g., BL0, BL2, BL3).

In one example, during a time period T0, the read voltage VR3 (e.g., ground voltage) can be applied to the bit lines BL, the source lines SL, and the word lines WL. By applying the read voltage VR3 (e.g., 0V) to the bit lines BL, the source lines SL, and the word lines WL, the memory cells 125 may not conduct current.

During a time period T1, the read voltage VR1 (e.g., 0.3~1.0V) can be applied to the selected source line (e.g., SL2) coupled to the selected memory cell (e.g., 125A) while the read voltage VR3 (e.g., 0V) is applied to unselected source lines (e.g., SL0, SL1, SL3). In addition, the read voltage VR3 can be applied to the bit lines (e.g., BL0-BL3). During the time period T1, the read voltage VR2 (e.g., 0.6~1.0V) is applied to the selected word line (e.g., WL1) coupled to the selected memory cell (e.g., 125A), while the read voltage VR3 (e.g., 0V) is applied to the unselected word lines (e.g., WL0, WL2, WL3). During the time period T1, because the voltage difference (e.g., VR2 or VR2-VR3) larger than the threshold voltage can be applied between the gate electrode and the source electrode of select transistor (e.g., 220A) of the selected memory cell (e.g., 125A) coupled to the selected word line (e.g., WL1) and the selected source line (e.g., SL2), the select transistor (e.g., 220A) of the selected memory cell (e.g., 125A) can be enabled. By enabling the select transistor (e.g., 220A) of the selected memory cell (e.g., 125A), current may flow through the select transistor (e.g., 220A) and the storage element (e.g., 210A) of the selected memory cell (e.g., 125A), according to the programmed state of the storage element 210A. Meanwhile, during the time period T1, because drain electrodes of the select transistors (e.g., 220B) and storage elements (e.g., 210B) of unselected memory cells (e.g., 125B) coupled to the selected word line (e.g., WL1) and unselected source lines (e.g., SL0, SL1, SL3) have the same voltage, current may not flow through the unselected memory cells 125 coupled to the selected word line WL and unselected source lines SL. In addition, during the time period T1, because the voltage difference (e.g., 0V or VR3-VR3) less than the threshold voltage can be applied between the gate electrodes and the source electrodes of select transistors (e.g., 220C) of unselected memory cells (e.g., 125C) coupled to the selected source line (e.g., SL2) and unselected word lines (e.g., WL0, WL2, WL3), the unselected memory cells 125 coupled to the selected source line (e.g., SL2) and unselected word lines (e.g., WL0, WL2, WL3) may not conduct current. Hence, programmed state of the selected memory cell 125A may be determined by sensing current through the selected bit line (e.g., BL1) or selected source line (e.g., SL2) coupled to the selected memory cell 125A.

After reading data stored by the selected memory cell (e.g., 125A), during the time period T2, the memory controller 105 applies voltages to the source lines SL, the word lines WL, and the bit lines BL as the voltages applied during the time period T0. Thus, detailed descriptions of duplicated portion thereof are omitted herein for the sake of brevity.

Advantageously, the voltages applied as shown in FIG. 6B can simplify the process of reading data stored by the memory cells 125. Moreover, only voltages applied to a selected source line SL and a selected word line WL are changed, such that the reading operation can be performed in a prompt and a reliable manner.

Figure 7:
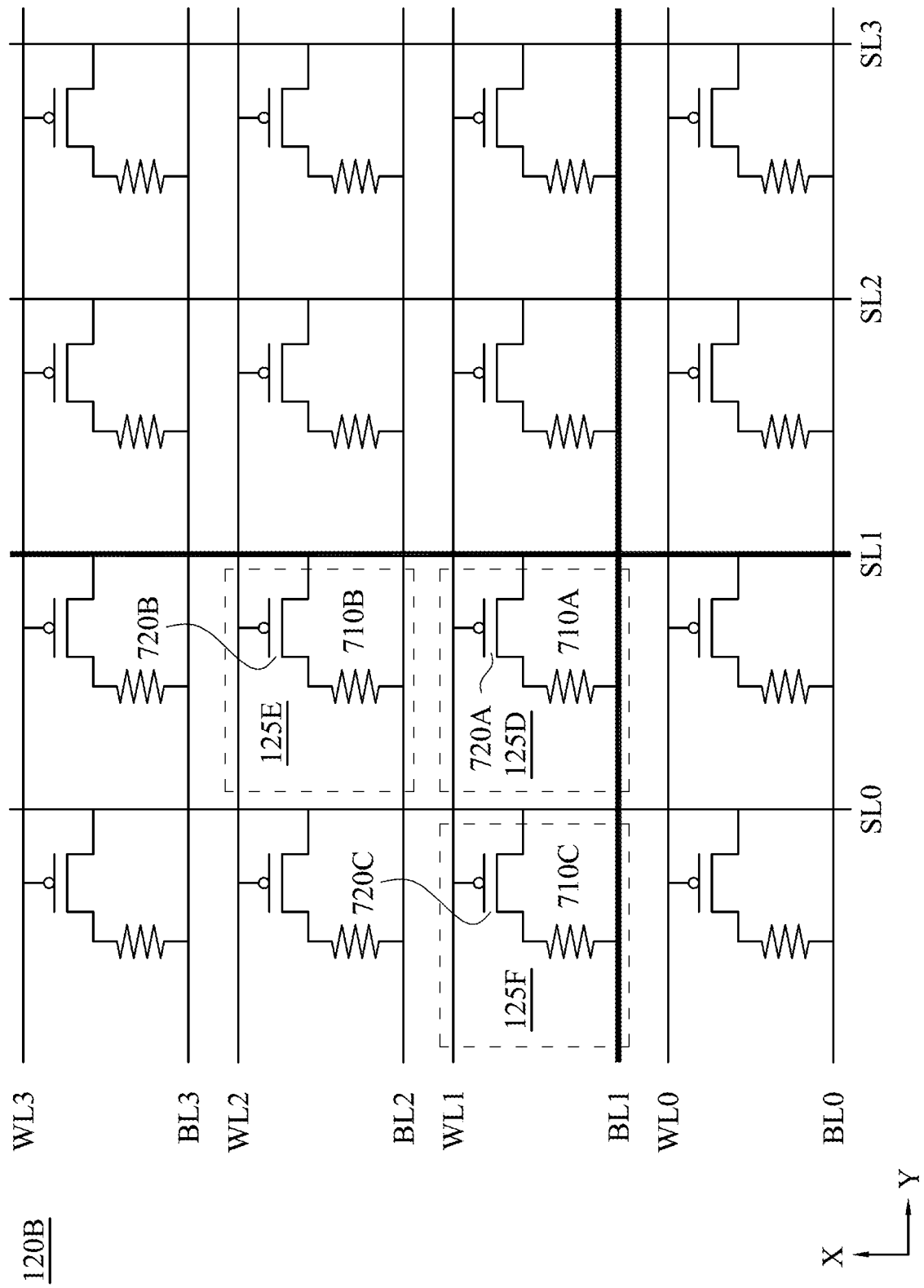
FIG. 7 illustrates a schematic diagram of a memory array, in accordance with some embodiments.

FIG. 7 illustrates a schematic diagram of a memory array 120B, in accordance with some embodiments. The memory array 120B may be a portion of the memory array 120 in FIG. 1. The memory array 120B may include an array of memory cells 125 (e.g., 125D, 125E, 125F). The memory array 120B may also include source lines SL0 . . . SL3 extending along a first direction (e.g., X-direction), bit lines BL0 . . . BL3 extending along a second direction (e.g., Y-direction), and word lines WL0 . . . WL3 extending along the second direction (e.g., Y-direction).

Each memory cell 125 may include a select transistor 720 and a storage element 710 connected in series between a corresponding bit line BL and a corresponding source line SL. The storage element 710 may be an e-fuse element, a MTJ cell, or any programmable resistor. The select transistor 720 may be a P-type transistor (e.g., P-type MOSFET, P-type BJT, P-type FinFET, etc.). In one configuration, one end of the storage element 710 is coupled to a corresponding bit line BL, and another end of the storage element 710 is coupled to a drain electrode of the select transistor 720. In one configuration, a gate electrode of the select transistor 720 is coupled to a corresponding word line WL, and a source electrode of the select transistor 720 is coupled to a corresponding source line SL. In this configuration, the memory cells 125 may have 1T1R structure to have a small form factor. In some embodiments, the select transistor 720 can be replaced by a component that can perform the functionalities of the select transistor 720 described herein.

Figure 8A:
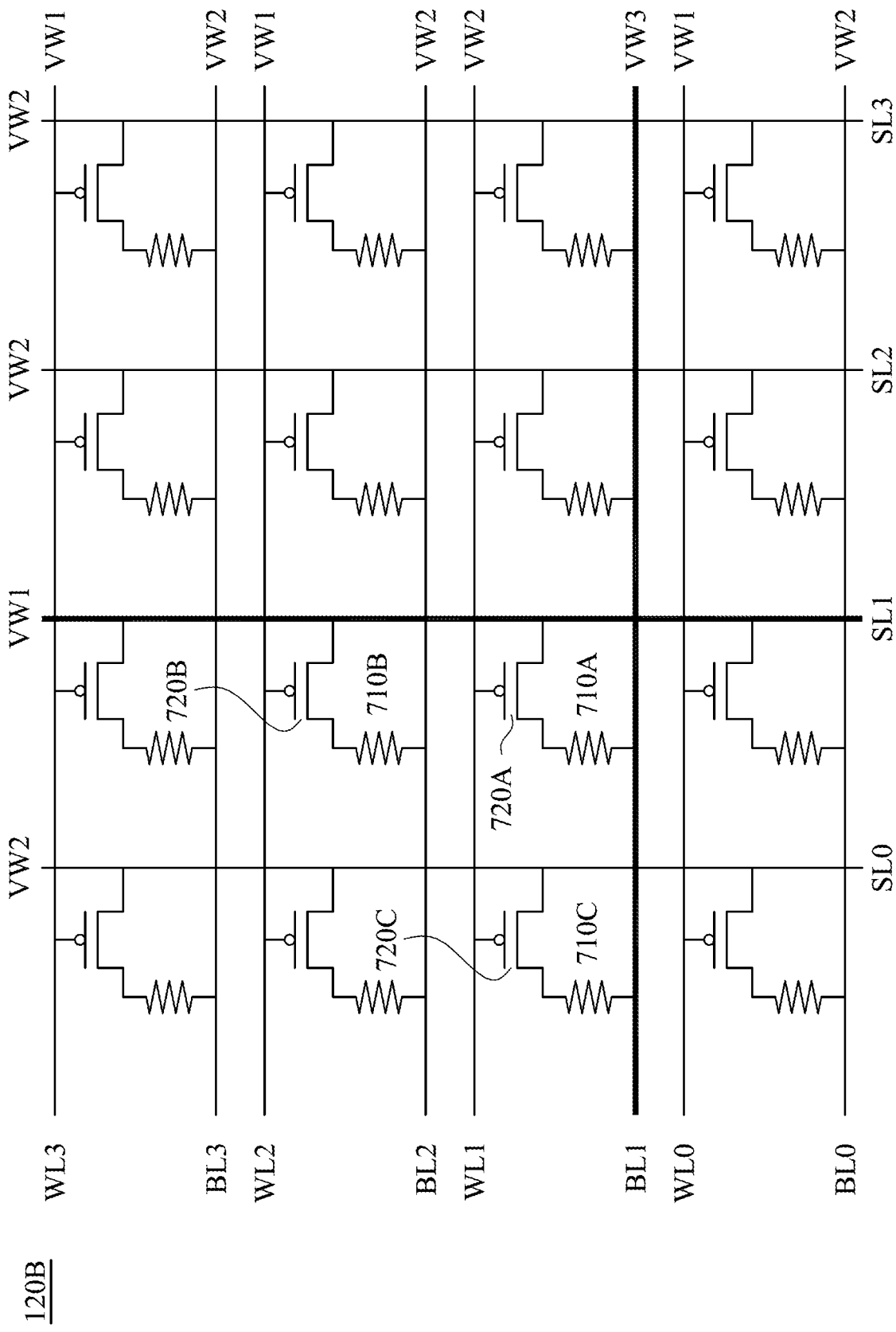
FIG. 8A illustrates example voltages applied to write data to a selected memory cell, in accordance with some embodiments.

FIG. 8A illustrates example voltages applied to the memory array 120B to write data to a selected memory cell (e.g., 125D), in accordance with some embodiments. In one aspect, the memory controller 105 applies write voltages VW1, VW2, VW3 to the source lines SL, bit lines BL, and the word lines WL as shown in FIG. 8A to write data to a selected memory cell 125D including the storage element 710A and the select transistor 720A. In one example, the write voltage VW1 may be a high voltage (e.g., higher than 1.5V) sufficient to burn or change the resistance of the storage element 710. The write voltage VW3 may be a ground voltage (e.g., 0V). The write voltage VW2 may be a voltage (e.g., 0.6~1.0V) between the write voltages VW1, VW3. In one aspect, the difference between the write voltages VW1, VW2 may be larger than a threshold voltage of the select transistor 720, but less than an allowable stress voltage of the select transistor 720. In addition, the difference between the write voltages VW2, VW3 may be less than an allowable stress voltage of the select transistor 720.

In one aspect, the write voltages VW1, VW2, VW3 applied as shown in FIG. 8A allow the selected memory cell 125D to be programmed. For example, the write voltage VW3 is applied to the storage element 710A through the bit line BL1, while the write voltage VW1 is applied to the source electrode of the select transistor 720A through the source line SL1, and the write voltage VW2 is applied to the gate electrode of the select transistor 720A through the word line WL1. Because the voltage difference (e.g., VW1-VW2) larger than a threshold voltage can be applied between the gate electrode and the source electrode of the select transistor 720A, the select transistor 720A can be enabled, such that a large voltage difference (e.g., VW1-VW3) can be applied across the storage element 710A. By applying the large voltage difference (e.g., VW1-VW3) across the storage element 710A, the storage element 710A can be burned and programmed accordingly.

Meanwhile, the write voltages VW1, VW2, VW3 applied as shown in FIG. 8A can prevent the unselected memory cell 125F coupled to the selected word line WL1 and coupled to unselected source line SL0 from being programmed, while the selected memory cell 125D is programmed. For example, the write voltage VW3 is applied to the storage element 710C through the bit line BL1, while the write voltage VW2 is applied to the source electrode of the select transistor 720C through the source line SL0, and the write voltage VW2 is applied to the gate electrode of the select transistor 720C through the word line WL1. Because the voltage difference (e.g., 0V or VW2-VW2) less than the threshold voltage can be applied between the gate electrode and the source electrode of the select transistor 720C, the select transistor 720C can be disabled to prevent the storage element 710C from being programmed.

Similarly, the write voltages VW1, VW2, VW3 applied as shown in FIG. 8A can prevent the unselected memory cell 125E coupled to the selected source line SL1 and coupled to unselected word line WL2 from being programmed, while the selected memory cell 125D is programmed. For example, the write voltage VW2 is applied to the storage element 710B through the bit line BL2, while the write voltage VW1 is applied to the source electrode of the select transistor 720B through the source line SL1, and the write voltage VW1 is applied to the gate electrode of the select transistor 720B through the word line WL2. Because the voltage difference (e.g., 0V or VW1-VW1) less than the threshold voltage can be applied between the gate electrode and the source electrode of the select transistor 720B, the select transistor 720B can be disabled to prevent the storage element 710B from being programmed.

Figure 8B:
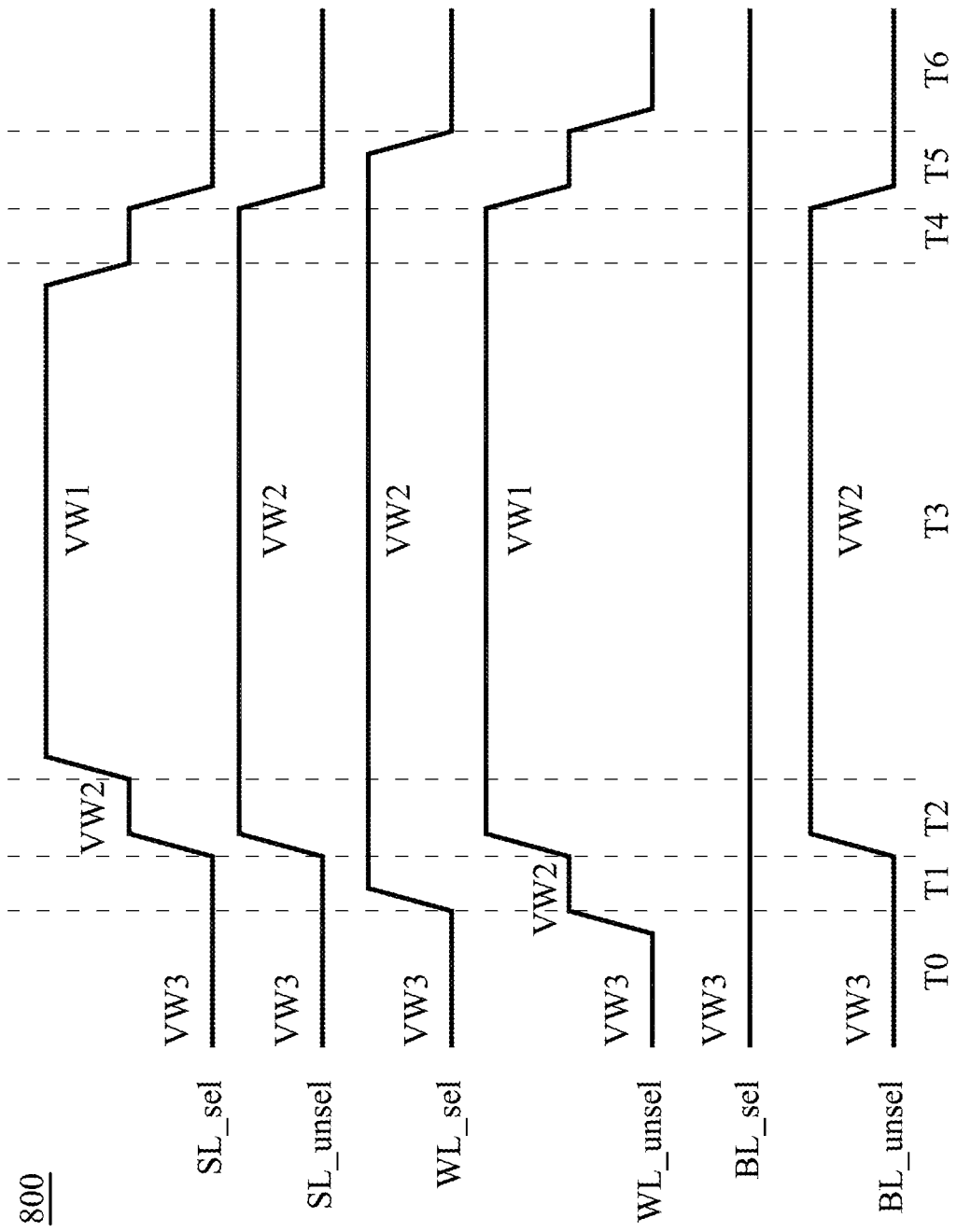
FIG. 8B illustrates a timing diagram of voltages applied for writing data to the selected memory cell, in accordance with some embodiments.

FIG. 8B illustrates a timing diagram 800 of voltages applied for writing data to the selected memory cell 125D, in accordance with some embodiments. In one approach, the memory controller 105 applies different voltage waveforms in different phases as shown in FIG. 8B to write data to the selected memory cell 125D. For example, the memory controller 105 may apply the voltage waveform SL_sel to the selected source line (e.g., SL1) coupled to the selected memory cell (e.g., 125D), and apply the voltage waveform SL_unsel to unselected source lines (e.g., SL0, SL2, SL3). For example, the memory controller 105 may apply the voltage waveform WL_sel to the selected word line (e.g., WL1) coupled to the selected memory cell (e.g., 125D), and apply the voltage waveform WL_unsel to unselected word lines (e.g., WL0, WL2, WL3). For example, the memory controller 105 may apply the voltage waveform BL_sel to the selected bit line (e.g., BL1) coupled to the selected memory cell (e.g., 125D), and apply the voltage waveform BL_unsel to unselected bit lines (e.g., BL0, BL2, BL3).

In one example, during a time period T0, the write voltage VW3 (e.g., ground voltage) can be applied to the bit lines BL, the source lines SL, and the word lines WL. By applying the write voltage VW3 (e.g., 0V) to the bit lines BL, the source lines SL, and the word lines WL, the memory cells 125 may not be programmed.

During a time period T1, the write voltage VW3 (e.g., 0 V) can be applied to the source lines (e.g., SL0-SL3). Meanwhile, the write voltage VW3 can be applied to the bit lines (e.g., BL0-BL3). In addition, the write voltage VW2 (e.g., 0.6V~1.0V) can be applied to the word lines (e.g., WL0-WL3). Because the voltage difference (e.g., −VW2 or VW3−VW2) less than the threshold voltage can be applied between the gate electrodes and the source electrodes of the select transistors 720 of the memory cells 125, the select transistors 720 can be disabled and the memory cells 125 may not be programmed.

During a time period T2, the write voltage VW2 (e.g., 0.6~1.0V) can be applied to the source lines (e.g., SL0-SL3). In addition, the write voltage VW3 can be applied to the selected bit line (e.g., BL1) coupled to the selected memory cell 125D, and the write voltage VW2 can be applied to the unselected bit lines (e.g., BL0, BL2, BL3). During the time period T2, the write voltage VW2 (e.g., 0.6~1.0V) is applied to the selected word line (e.g., WL1) coupled to the selected memory cell (e.g., 125D), while the write voltage VW1 (e.g., higher than 1.5V) is applied to the unselected word lines (e.g., WL0, WL2, WL3). Even though the write voltage VW2 is applied to the selected word line (e.g., WL1) coupled to the selected memory cell (e.g., 125D) during the time period T2, the voltage difference (e.g., 0V or VW2-VW2) less than the threshold voltage can be applied between the gate electrodes and the source electrodes of select transistors (e.g., 720A, 720C) coupled to the selected word line (e.g., WL1), such that the select transistors (e.g., 720A, 720C) coupled to the selected word line (e.g., WL1) can be disabled and memory cells 125 coupled to the selected word line (e.g., WL1) may not be programmed.

During a time period T3, the write voltage VW1 (e.g., higher than 1.5V) can be applied to the selected source line (e.g., SL1) coupled to the selected memory cell (e.g., 125D) while the write voltage VW2 (e.g., 0.6~1.0V) is applied to unselected source lines (e.g., SL0, SL2, SL3). In addition, the write voltage VW3 can be applied to the selected bit line (e.g., BL1) coupled to the selected memory cell 125D, and the write voltage VW2 can be applied to the unselected bit lines (e.g., BL0, BL2, BL3). During the time period T3, the write voltage VW2 (e.g., 0.6~1.0V) is applied to the selected word line (e.g., WL1) coupled to the selected memory cell (e.g., 125D), while the write voltage VW1 (e.g., higher than 1.5V) is applied to the unselected word lines (e.g., WL0, WL2, WL3). During the time period T3, because the voltage difference (e.g., VW1-VW2) larger than the threshold voltage can be applied between the gate electrode and the source electrode of the select transistor (e.g., 720A) of the selected memory cell (e.g., 125D) coupled to the selected word line (e.g., WL1) and the selected source line (e.g., SL1), the select transistor (e.g., 720A) of the selected memory cell (e.g., 125D) can be enabled. By enabling the select transistor (e.g., 720A) of the selected memory cell (e.g., 125D), high voltage (e.g., VW1-VW3) can be applied across the storage element (e.g., 710A) of the selected memory cell (e.g., 125D) to program data. Meanwhile, during the time period T3, because the voltage difference (e.g., 0V or VW2-VW2) less than the threshold voltage can be applied between the gate electrodes and the source electrodes of select transistors (e.g., 720C) of unselected memory cells 125 coupled to the selected word line (e.g., WL1) and unselected source lines (e.g., SL0, SL2, SL3), the select transistors (e.g., 720C) coupled to the selected word line (e.g., WL1) and unselected source lines (e.g., SL0, SL2, SL3) can be disabled and the unselected memory cells 125 coupled to the selected word line (e.g., WL1) and unselected source lines (e.g., SL0, SL2, SL3) may not be programmed. In addition, during the time period T3, because the voltage difference (e.g., 0V or VW1-VW1) less than the threshold voltage can be applied between the gate electrodes and the source electrodes of select transistors (e.g., 720B) of unselected memory cells 125 coupled to the selected source line (e.g., SL1) and unselected word lines (e.g., WL0, WL2, WL3), the select transistors (e.g., 720B) coupled to the selected source line (e.g., SL1) and unselected word lines (e.g., WL0, WL2, WL3) can be disabled and the unselected memory cells 125 coupled to the selected source line (e.g., SL1) and unselected word lines (e.g., WL0, WL2, WL3) may not be programmed.

In one aspect, a transition period (e.g., T1, T2) is shorter than a programming time period (e.g., T3). For example, the transition time period (e.g., T1, T2) may be 0.1 ns~5 ns to ensure enough time for bit lines BL, word lines WL, source lines SL to charge or discharge to steady state voltages to avoid un-wanted current flowing through memory cell 125 during transition. Meanwhile, the programming time period (e.g., T3) may be 1 us~10 us to allow sufficient current to flow through the memory cell 125 and ensure correct programming.

After programming the selected memory cell (e.g., 125D), the memory controller 105 may apply voltages during the time periods T4, T5, T6, as voltages applied during the time periods T2, T1, T0, respectively. For example, during the time period T4, the memory controller 105 applies voltages to the source lines SL, the word lines WL, and the bit lines BL, as the voltages applied during the time period T2. For example, during the time period T5, the memory controller 105 applies voltages to the source lines SL, the word lines WL, and the bit lines BL, as the voltages applied during the time period T1. For example, during the time period T6, the memory controller 105 applies voltages to the source lines SL, the word lines WL, and the bit lines BL as the voltages applied during the time period T0. Thus, detailed descriptions of duplicated portion thereof are omitted herein for the sake of brevity.

Advantageously, the memory array 120B may be programmed and operate in a reliable manner. In one aspect, the difference between the write voltages VW1, VW2 may be larger than a threshold voltage of the select transistor 720, but less than an allowable stress voltage of the select transistor 720. In addition, the difference between the write voltages VW2, VW3 may be less than an allowable stress voltage of the select transistor 720. Accordingly, no excessive voltage may be applied to the select transistors 720 during programming, such that the memory cells 125 may be programmed without damaging the select transistors 720.

Figure 9A:
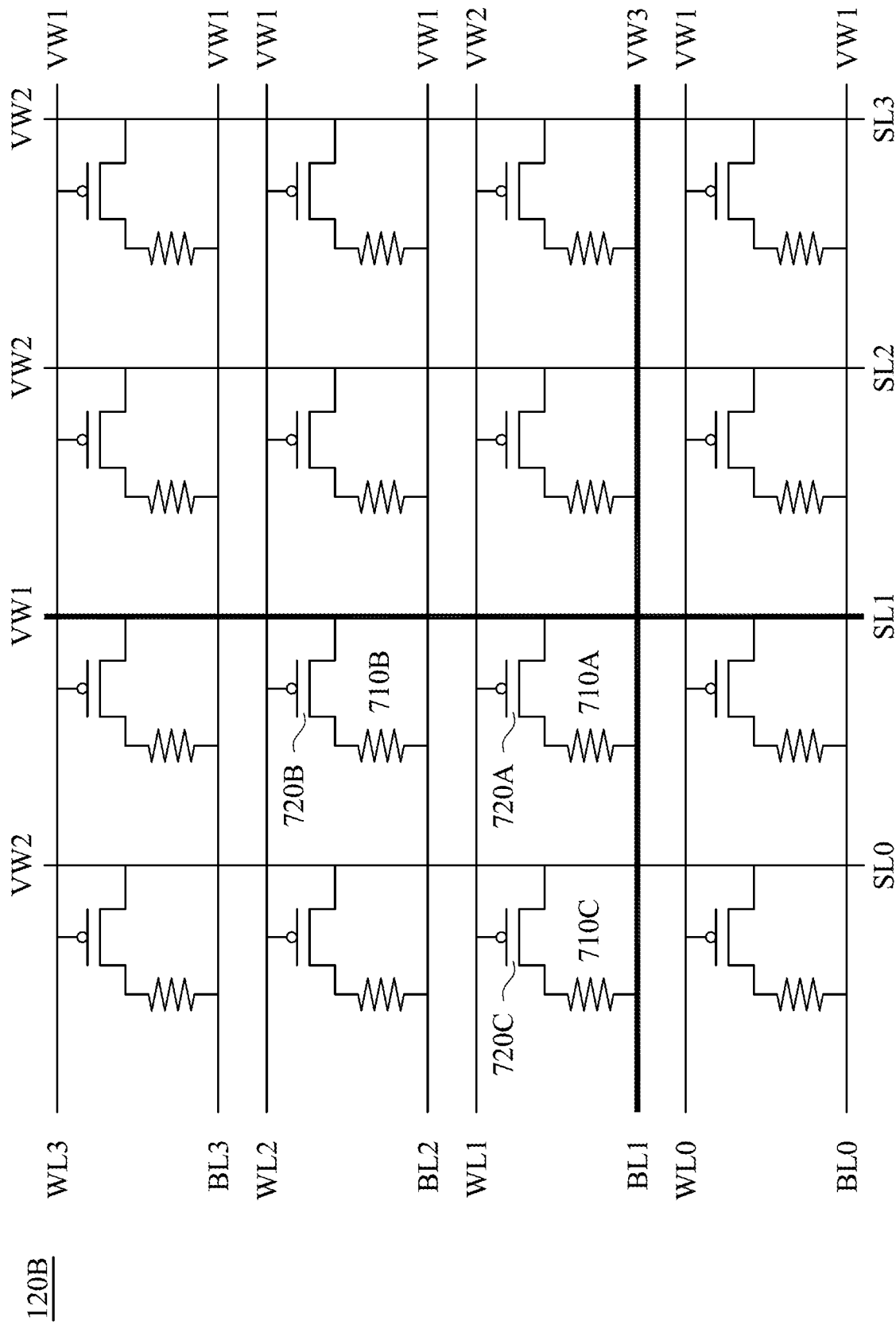
FIG. 9A illustrates example voltages applied to write data to a selected memory cell, in accordance with some embodiments.

FIG. 9A illustrates example voltages applied to write data to a selected memory cell, in accordance with some embodiments. The voltages applied in FIG. 9A are similar to the voltages applied in FIG. 8A, except the write voltage VW1 is applied to the unselected bit lines (e.g., BL0, BL2, BL3). Thus, detailed descriptions of duplicated portion thereof are omitted herein for the sake of brevity. In one aspect, applying the write voltage VW1 to the unselected bit lines (e.g., BL0, BL2, BL3) can ensure that no voltage stress is applied to memory cells 125 coupled to the unselected bit lines (e.g., BL0, BL2, BL3).

Figure 9B:
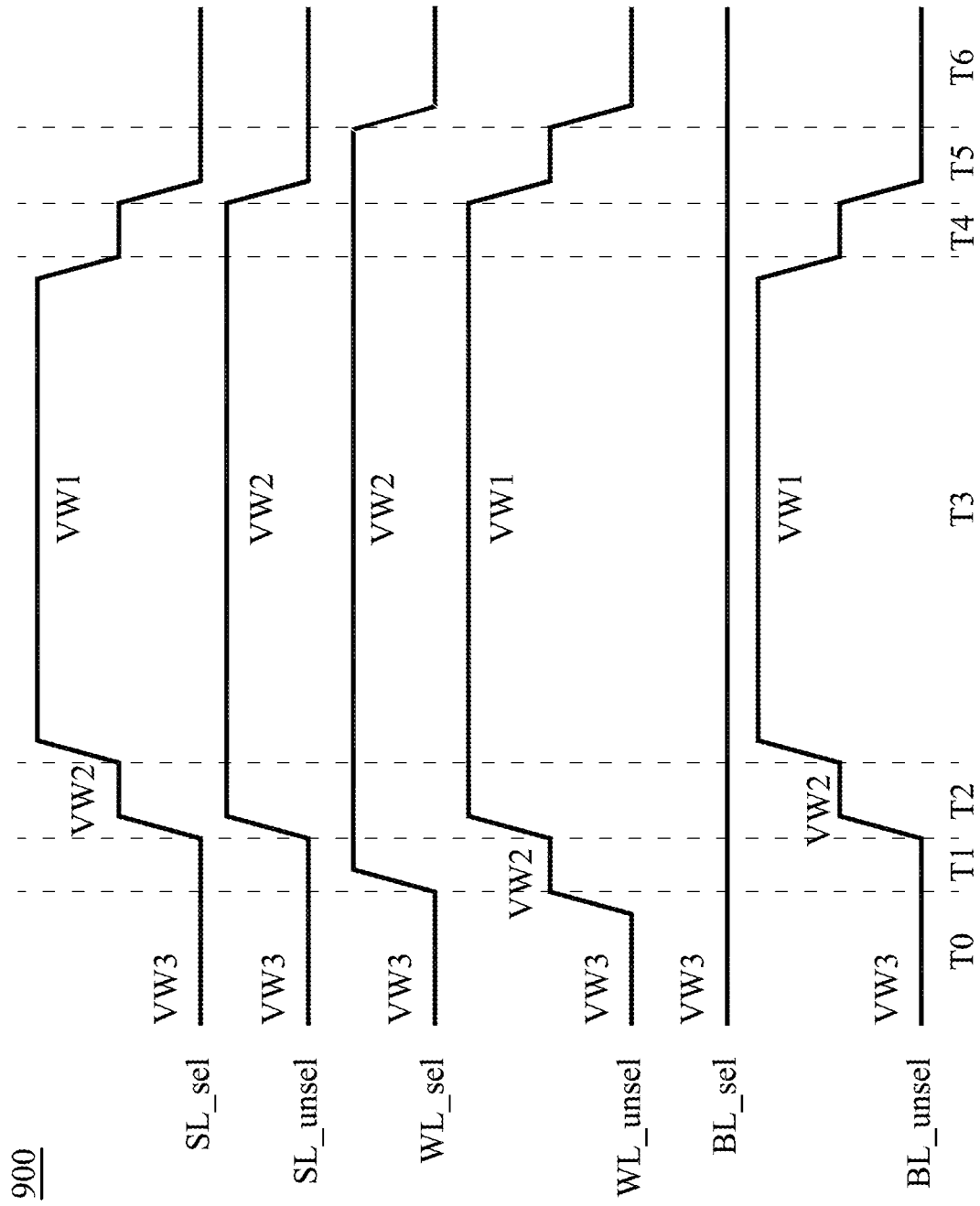
FIG. 9B illustrates a timing diagram of voltages applied for writing data to the selected memory cell, in accordance with some embodiments.

FIG. 9B illustrates a timing diagram of voltages applied for writing data to the selected memory cell, in accordance with some embodiments. The timing diagram 900 is similar to the timing diagram 800 except, the write voltage VW1 is applied to unselected bit lines (e.g., BL0, BL2, BL3) during the time period T3. By applying the write voltage VW1 to the unselected bit lines (e.g., BL0, BL2, BL3), no voltage stress can be applied to memory cells 125 coupled to the unselected bit lines (e.g., BL0, BL2, BL3).

Figure 10A:
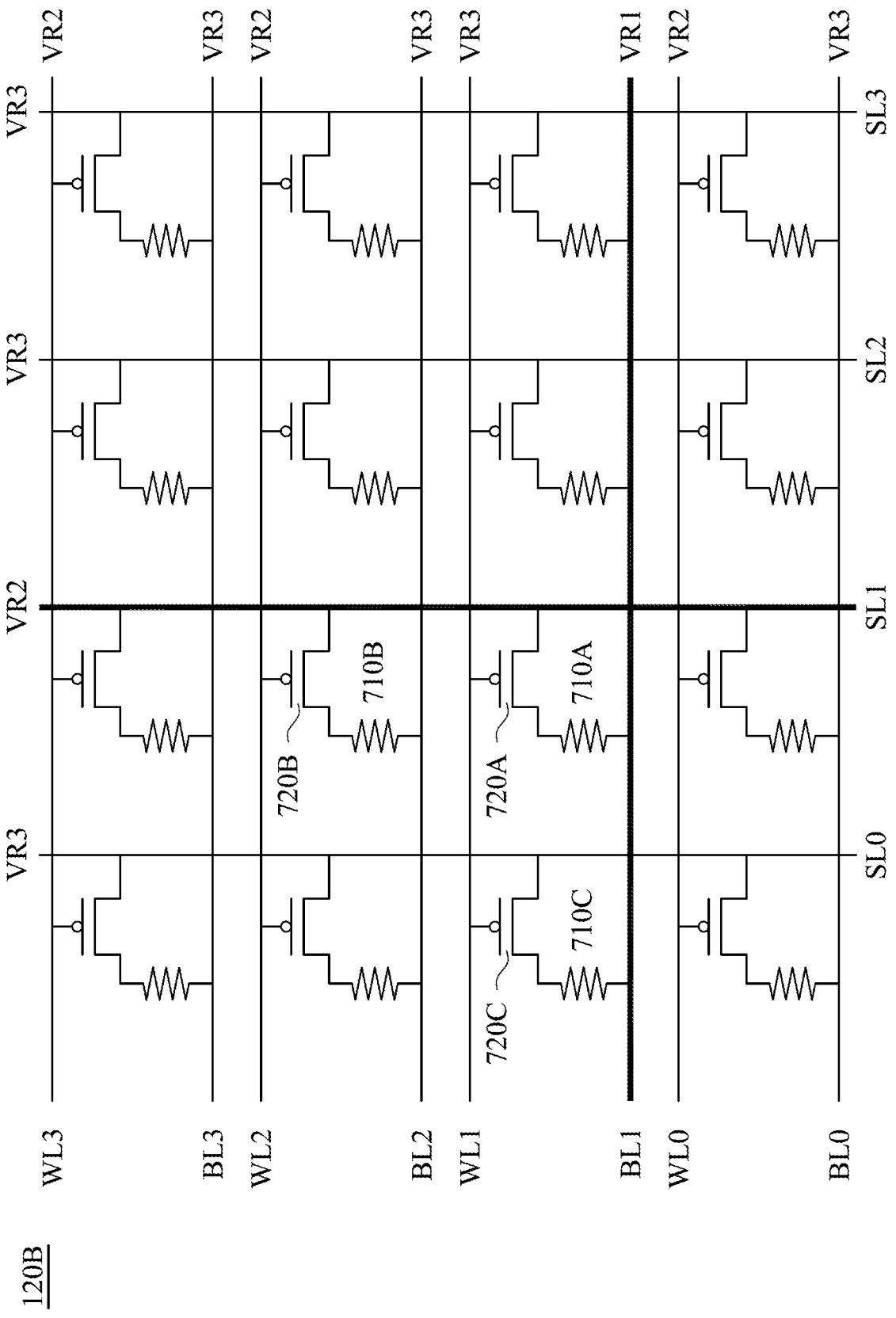
FIG. 10A illustrates example voltages applied to read data stored by a selected memory cell, in accordance with some embodiments.

FIG. 10A illustrates example voltages applied to the memory array 120B to read data stored by a selected memory cell 125D, in accordance with some embodiments. In one aspect, the memory controller 105 applies read voltages VR1, VR2, VR3 to the source lines SL, bit lines BL, and the word lines WL as shown in FIG. 10A to read data stored by a selected memory cell 125D including the storage element 710A and the select transistor 720A. In one example, the read voltage VR1 may be a voltage (e.g., 0.3V~0.7V) to allow current flow through the selected memory cell (e.g., 125D). The read voltage VR3 may be a ground voltage (e.g., 0V). The read voltage VR2 may be a voltage (e.g., 0.6~1.0V) larger than the read voltage VR1.

In one aspect, the read voltages VR1, VR2, VR3 applied as shown in FIG. 10A allow the selected memory cell 125D to conduct current, according to the programmed state. For example, the read voltage VR1 is applied to the storage element 710A through the bit line BL1, while the read voltage VR2 is applied to the source electrode of the select transistor 720A through the source line SL1, and the read voltage VR3 is applied to the gate electrode of the select transistor 720A through the word line WL1. Because the voltage difference (e.g., VR2-VR3) larger than the threshold voltage can be applied between the gate electrode and the source electrode of the select transistor 720A, the select transistor 720A can be enabled and conduct current according to the programmed state of the storage element 710A. For example, if the storage element 710A is burned or programmed, then no current may flow through the select transistor 720A. For example, if the storage element 710A is not burned or not programmed, then current may flow through the select transistor 720A. The bit line controller 112 may sense current through the selected bit line BL coupled to the selected memory cell 125 or the source line controller 118 may sense current through the selected source line SL coupled to the selected memory cell 125 to determine the programmed state of the selected memory cell 125.

Meanwhile, the read voltages VR1, VR2, VR3 applied as shown in FIG. 10A can prevent the unselected memory cell 125F coupled to the selected word line WL1 and unselected source line SL0 from conducting current, while the selected memory cell 125D may conduct current according to the programmed state. For example, the read voltage VR1 is applied to the storage element 710C through the bit line BL1, while the read voltage VR3 is applied to the source electrode of the select transistor 720C through the source line SL0, and the read voltage VR3 is applied to the gate electrode of the select transistor 720C through the word line WL1. Because the voltage difference (e.g., 0V or VR3-VR3) less than the threshold voltage can be applied between the gate electrode and the source electrode of the select transistor 720C, the select transistor 720C can be disabled and the unselected memory cell 125F may not conduct current.

Similarly, the read voltages VR1, VR2, VR3 applied as shown in FIG. 10A can prevent the unselected memory cell 125E coupled to the selected source line SL1 and unselected word line WL2 from conducting current, while the selected memory cell 125D may conduct current according to the programmed state. For example, the read voltage VR3 is applied to the storage element 710B through the bit line BL2, while the read voltage VR2 is applied to the source electrode of the select transistor 720B through the source line SL1, and the read voltage VR2 is applied to the gate electrode of the select transistor 720B through the word line WL2. Because the voltage difference (e.g., 0V) less than the threshold voltage can be applied between the gate electrode and the source electrode of the select transistor 720B, the select transistor 720B can be disabled and the unselected memory cell 125E may not conduct current.

Figure 10B:
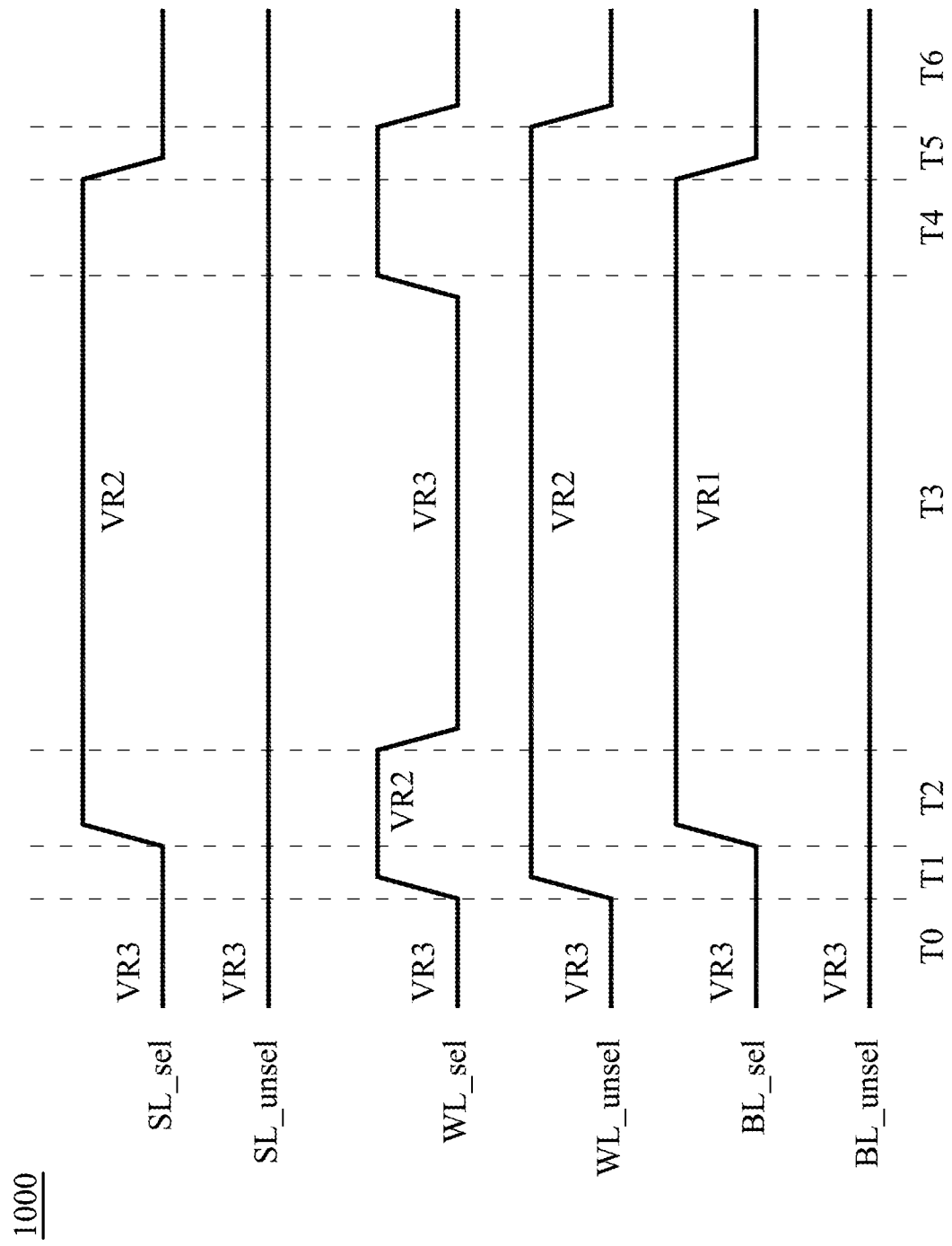
FIG. 10B illustrates a timing diagram of voltages applied for reading data stored by a selected memory cell, in accordance with some embodiments.

FIG. 10B illustrates a timing diagram 1000 of voltages applied for reading data stored by a selected memory cell (e.g., 125D), in accordance with some embodiments. In one approach, the memory controller 105 applies different voltage waveforms in different phases as shown in FIG. 10B to read data stored by the selected memory cell 125D. For example, the memory controller 105 may apply the voltage waveform SL_sel to the selected source line (e.g., SL1) coupled to the selected memory cell (e.g., 125D), and apply the voltage waveform SL_unsel to unselected source lines (e.g., SL0, SL2, SL3). For example, the memory controller 105 may apply the voltage waveform WL_sel to the selected word line (e.g., WL1) coupled to the selected memory cell (e.g., 125D), and apply the voltage waveform WL_unsel to unselected word lines (e.g., WL0, WL2, WL3). For example, the memory controller 105 may apply the voltage waveform BL_sel to the selected bit line (e.g., BL1) coupled to the selected memory cell (e.g., 125D), and apply the voltage waveform BL_unsel to unselected bit lines (e.g., BL0, BL2, BL3).

In one example, during a time period T0, the read voltage VR3 (e.g., ground voltage) can be applied to the bit lines BL, the source lines SL, and the word lines WL. By applying the read voltage VR3 (e.g., 0V) to the bit lines BL, the source lines SL, and the word lines WL, the memory cells 125 may not conduct current.

During a time period T1, the read voltage VR3 (e.g., 0V) can be applied to the source lines (e.g., SL0-SL3). Meanwhile, the read voltage VR3 can be applied to the bit lines (e.g., BL0-BL3). In addition, the read voltage VR2 (e.g., 0.6V~1.0V) can be applied to the word lines (e.g., WL0-WL3). Because the voltage difference (e.g., -VR2 or VR3-VR2) less than the threshold voltage can be applied between the gate electrode and the source electrode of the select transistors 720, the select transistors 720 can be disabled and the memory cells 125 may not conduct current.

During a time period T2, the read voltage VR2 (e.g., 0.6~1.0V) can be applied to the selected source line (e.g., SL1) coupled to the selected memory cell 125D, while the read voltage VR3 is applied to the unselected source lines (e.g., SL0, SL2, SL3). In addition, the read voltage VR1 (e.g., 0.3~1.0V) can be applied to the selected bit line (e.g., BL1) coupled to the selected memory cell 125D, and the read voltage VR3 can be applied to the unselected bit lines (e.g., BL0, BL2, BL3). During the time period T2, the read voltage VR2 (e.g., 0.6~1.0V) is applied to the word lines (e.g., WL0-WL3). By applying the read voltage VR2 to the word lines (e.g., WL0-WL3), the select transistors 720 can be disabled and no current may flow through the memory cells 125.

During a time period T3, the read voltage VR2 (e.g., 0.6~1.0V) can be applied to the selected source line (e.g., SL1) coupled to the selected memory cell 125D, while the read voltage VR3 is applied to the unselected source lines (e.g., SL0, SL2, SL3). In addition, the read voltage VR1 (e.g., 0.3~1.0V) can be applied to the selected bit line (e.g., BL1) coupled to the selected memory cell 125D, and the read voltage VR3 can be applied to the unselected bit lines (e.g., BL0, BL2, BL3). During the time period T3, the read voltage VR3 (e.g., 0V) is applied to the selected word line (e.g., WL1), while the read voltage VR2 is applied to the unselected word lines (e.g., WL0, WL2, WL3). During the time period T3, because the voltage difference (e.g., VR2 or VR2-VR3) larger than the threshold voltage can be applied between the gate electrode and the source electrode of select transistor (e.g., 720A) of the selected memory cell (e.g., 125D) coupled to the selected word line (e.g., WL1) and the selected source line (e.g., SL1), the select transistor (e.g., 720A) of the selected memory cell (e.g., 125D) can be enabled. By enabling the select transistor (e.g., 720A) of the selected memory cell (e.g., 125D), current may flow through the select transistor (e.g., 720A) and the storage element (e.g., 710A) of the selected memory cell (e.g., 125D), according to the programmed state of the storage element 710A. Meanwhile, during the time period T3, because source electrodes of the select transistors (e.g., 720C) and storage elements (e.g., 710C) of unselected memory cells (e.g., 125F) coupled to the selected word line (e.g., WL1) and unselected source lines (e.g., SL0, SL2, SL3) have the same voltage, the select transistors (e.g., 720C) of the unselected memory cells (e.g., 125F) coupled to the selected word line (e.g., WL1) and the unselected source lines (e.g., SL0, SL2, SL3) may be disabled to prevent current through the unselected memory cells 125 coupled to the selected word line (e.g., WL1) and unselected source lines (e.g., SL0, SL2, SL3). In addition, during the time period T3, because source electrodes of the select transistors (e.g., 720B) and storage elements (e.g., 710B) of unselected memory cells (e.g., 125E) coupled to the selected source line (e.g., SL1) and unselected word lines (e.g., WL0, WL2, WL3) have the same voltage, the select transistors (e.g., 720B) and storage elements (e.g., 710B) of the unselected memory cells (e.g., 125E) coupled to the selected source line (e.g., SL1) and the unselected word lines (e.g., WL0, WL2, WL3) may be disabled to prevent current through the unselected memory cells (125E) coupled to the selected source line (e.g., SL1) and the unselected word lines (e.g., WL0, WL2, WL3). Hence, programmed state of the selected memory cell 125D may be determined by sensing current through the selected bit line (e.g., BL1) or selected source line (e.g., SL1) coupled to the selected memory cell 125D.

In one aspect, a transition period (e.g., T1, T2) is shorter than a reading time period (e.g., T3). For example, the transition time period (e.g., T1, T2) may be 0.1 ns~5 ns to ensure enough time for bit lines BL, word lines WL, source lines SL to charge or discharge to steady state voltages to avoid un-wanted current flowing through memory cell 125 during transition. Meanwhile, the reading time period (e.g., T3) may be 1 us~10 us to allow sufficient current to flow through the memory cell 125 and ensure correct reading.

After reading data stored by the selected memory cell (e.g., 125D), the memory controller 105 may apply voltages during the time periods T4, T5, T6, as in the time periods T2, T1, T0, respectively. For example, during the time period T4, the memory controller 105 applies voltages to the source lines SL, the word lines WL, and the bit lines BL as the voltages applied during the time period T2. For example, during the time period T5, the memory controller 105 applies voltages to the source lines SL, the word lines WL, and the bit lines BL as the voltages applied during the time period T1. For example, during the time period T6, the memory controller 105 applies voltages to the source lines SL, the word lines WL, and the bit lines BL as the voltages applied during the time period T0. Thus, detailed descriptions of duplicated portion thereof are omitted herein for the sake of brevity.

Figure 11A:
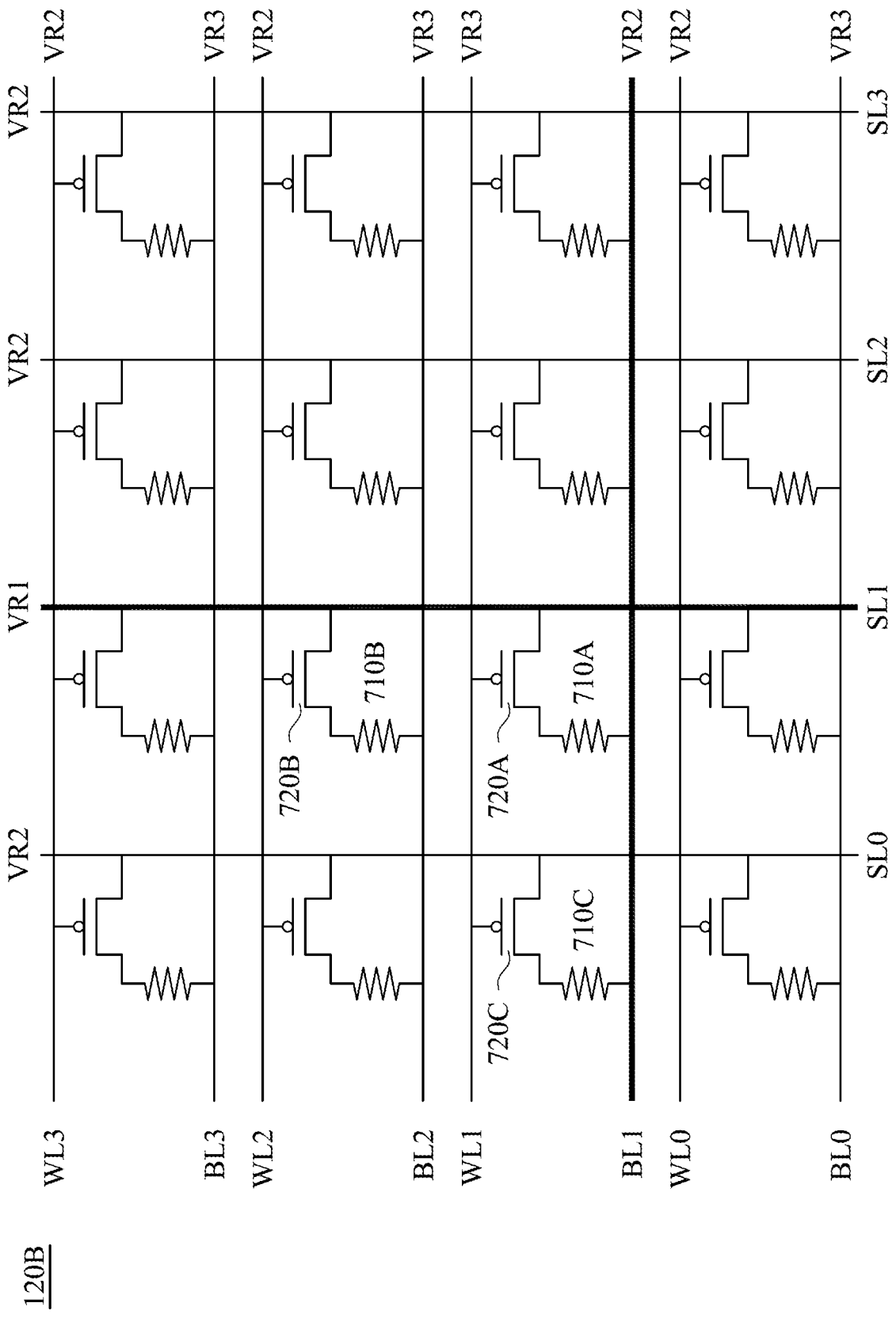
FIG. 11A illustrates example voltages applied to read data stored by a selected memory cell, in accordance with some embodiments.

FIG. 11A illustrates example voltages applied to read data stored by a selected memory cell, in accordance with some embodiments. In one aspect, the memory controller 105 applies read voltages VR1, VR2, VR3 to the source lines SL, bit lines BL, and the word lines WL as shown in FIG. 11A to read data stored by a selected memory cell 125D including the storage element 710A and the select transistor 720A. In one example, the read voltage VR1 may be a voltage (e.g., 0.3V~0.7V) to allow current flow through the selected memory cell (e.g., 125D). The read voltage VR3 may be a ground voltage (e.g., 0V). The read voltage VR2 may be a voltage (e.g., 0.6~1.0V) larger than the read voltage VR1.

In one aspect, the read voltages VR1, VR2, VR3 applied as shown in FIG. 11A allow the selected memory cell 125D to conduct current, according to the programmed state. For example, the read voltage VR2 is applied to the storage element 710A through the bit line BL1, while the read voltage VR1 is applied to the source electrode of the select transistor 720A through the source line SL1, and the read voltage VR3 is applied to the gate electrode of the select transistor 720A through the word line WL1. Because the voltage difference (e.g., VR3-VR1) larger than the threshold voltage can be applied between the gate electrode and the source electrode of the select transistor 720A, the select transistor 720A can be enabled and conduct current according to the programmed state of the storage element 710A. For example, if the storage element 710A is burned or programmed, then no current may flow through the select transistor 720A. For example, if the storage element 710A is not burned or not programmed, then current may flow through the select transistor 720A. The bit line controller 112 may sense current through the selected bit line BL coupled to the selected memory cell 125 or the source line controller 118 may sense current through the selected source line SL coupled to the selected memory cell 125 to determine the programmed state of the selected memory cell 125.

Meanwhile, the read voltages VR1, VR2, VR3 applied as shown in FIG. 11A can prevent the unselected memory cell 125F coupled to the selected word line WL1 and unselected source line SL0 from conducting current, while the selected memory cell 125D may conduct current according to the programmed state. For example, the read voltage VR2 is applied to the storage element 710C through the bit line BL1, while the read voltage VR2 is applied to the source electrode of the select transistor 720C through the source line SL0, and the read voltage VR3 is applied to the gate electrode of the select transistor 720C through the word line WL1. Because the storage element 710C and the source electrode of the transistor 720C have the same voltage, the unselected memory cell 125F may not conduct current.

Similarly, the read voltages VR1, VR2, VR3 applied as shown in FIG. 11A can prevent the unselected memory cell 125E coupled to the selected source line SL1 and unselected word line WL2 from conducting current, while the selected memory cell 125D may conduct current according to the programmed state. For example, the read voltage VR3 is applied to the storage element 710B through the bit line BL2, while the read voltage VR1 is applied to the source electrode of the select transistor 720B through the source line SL1, and the read voltage VR2 is applied to the gate electrode of the select transistor 720B through the word line WL2. Because the voltage difference (e.g., VR1-VR2) less than the threshold voltage can be applied between the gate electrode and the source electrode of the select transistor 720B, the select transistor 720B can be disabled and the unselected memory cell 125E may not conduct current.

Figure 11B:
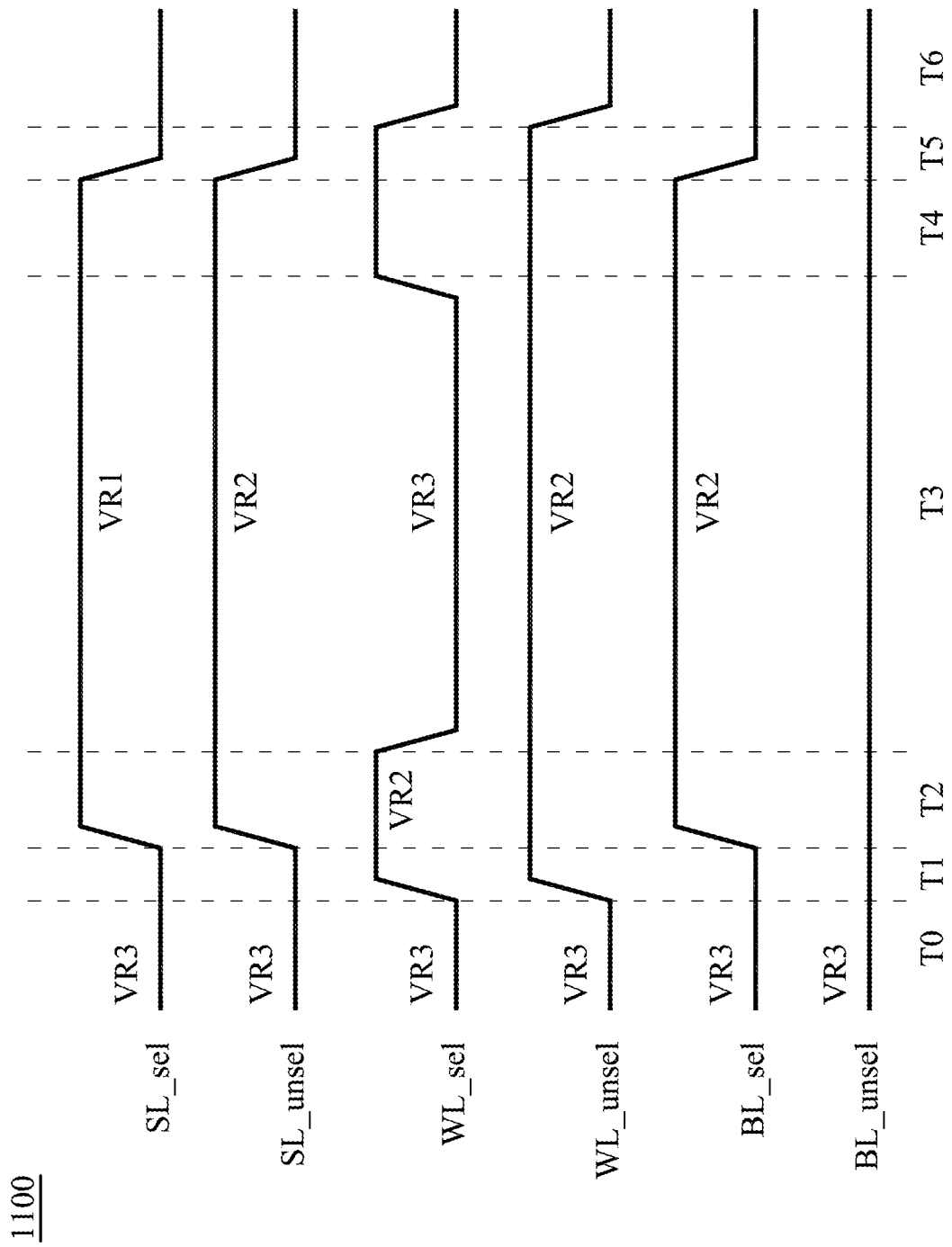
FIG. 11B illustrates a timing diagram of voltages applied for reading data stored by a selected memory cell, in accordance with some embodiments.

FIG. 11B illustrates a timing diagram 1100 of voltages applied for reading data stored by a selected memory cell (e.g., 125D), in accordance with some embodiments. In one approach, the memory controller 105 applies different voltage waveforms in different phases as shown in FIG. 11B to read data stored by the selected memory cell 125D. For example, the memory controller 105 may apply the voltage waveform SL_sel to the selected source line (e.g., SL1) coupled to the selected memory cell (e.g., 125D), and apply the voltage waveform SL_unsel to unselected source lines (e.g., SL0, SL2, SL3). For example, the memory controller 105 may apply the voltage waveform WL_sel to the selected word line (e.g., WL1) coupled to the selected memory cell (e.g., 125D), and apply the voltage waveform WL_unsel to unselected word lines (e.g., WL0, WL2, WL3). For example, the memory controller 105 may apply the voltage waveform BL_sel to the selected bit line (e.g., BL1) coupled to the selected memory cell (e.g., 125D), and apply the voltage waveform BL_unsel to unselected bit lines (e.g., BL0, BL2, BL3). In one aspect, the timing diagram 1100 is similar to the timing diagram 1000, except the read voltage VR1 is applied to the selected source line during the time periods T2-T4 instead of the read voltage VR2; the read voltage VR2 is applied to the unselected source line during the time periods T2-T4 instead of the read voltage VR3; and the read voltage VR2 is applied to the selected bit line during the time periods T2-T4 instead of the read voltage VR1. Thus, detailed description on duplicated portion thereof is omitted herein for the sake of brevity.

Figure 12:
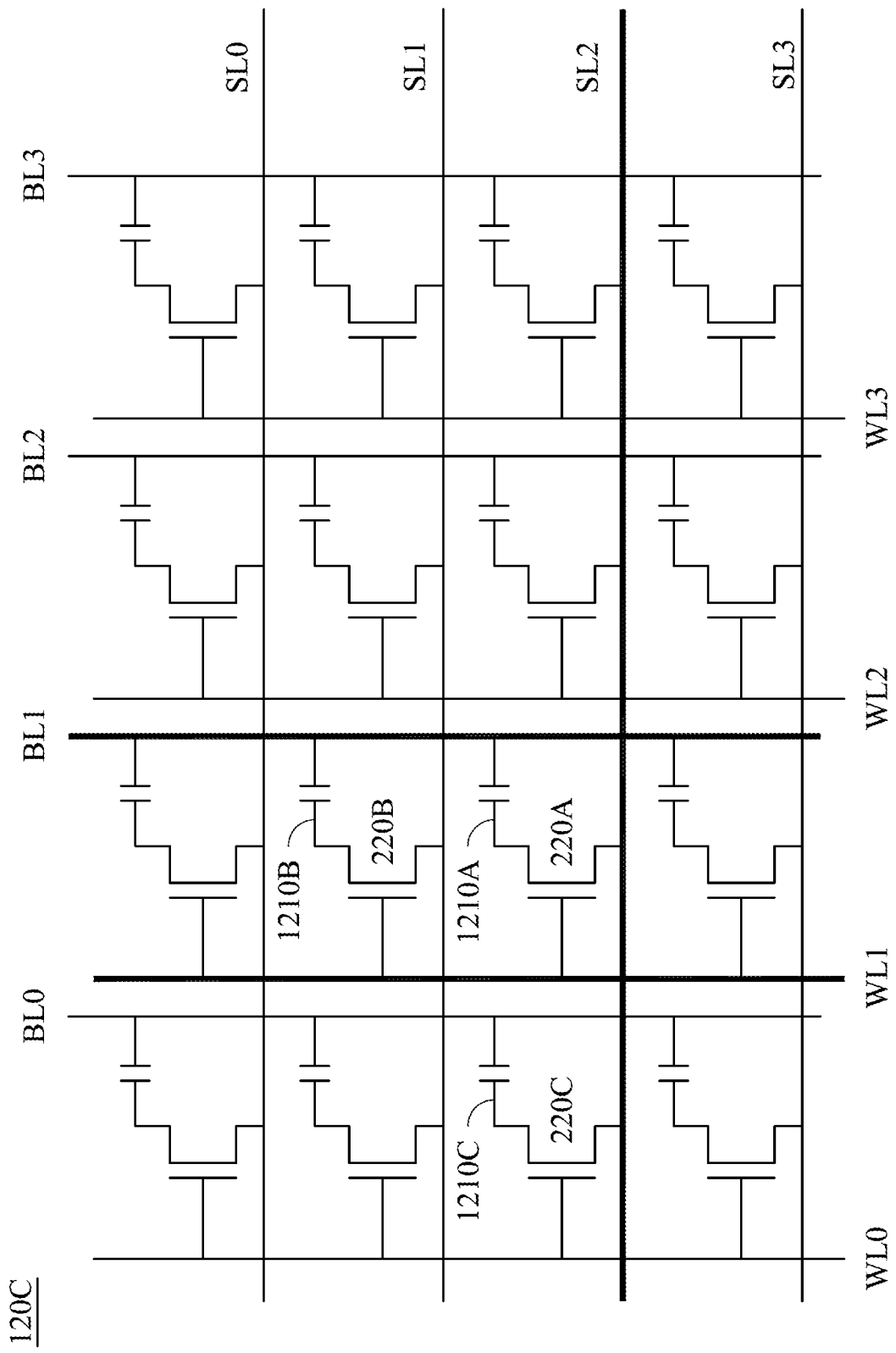
FIG. 12 illustrates a schematic diagram of a memory array, in accordance with some embodiments.

FIG. 12 illustrates a schematic diagram of a memory array 120C, in accordance with some embodiments. The memory array 120C may be a portion of the memory array 120 in FIG. 1. The memory array 120C is similar to the memory array 120A in FIG. 2, except each memory cell 125 in the memory array 120C includes a storage element 1210 instead of the storage element 210. The storage element 1210 may be a MIM capacitor or any capacitor. Hence, the memory cell 125 may have a 1T1C configuration. The memory array 120C may be operated and configured in a similar manner as described above with respect to FIG. 3A, FIG. 3B, FIG. 4A, FIG. 4B, FIG. 5A, FIG. 5B, FIG. 6A, FIG. 6B. In one aspect, 1T1R cell has a low impedance (short) before programming and a high impedance (open) after programming, because the resistive storage element (e.g., 210) or a metal rail breaks after programming. Meanwhile, 1T1C cell has a high impedance (open) before programming and a low impedance (short) after programming, because the capacitive storage element (e.g., 1210) or an insulator breaks to form a short channel after programming.

Figure 13:
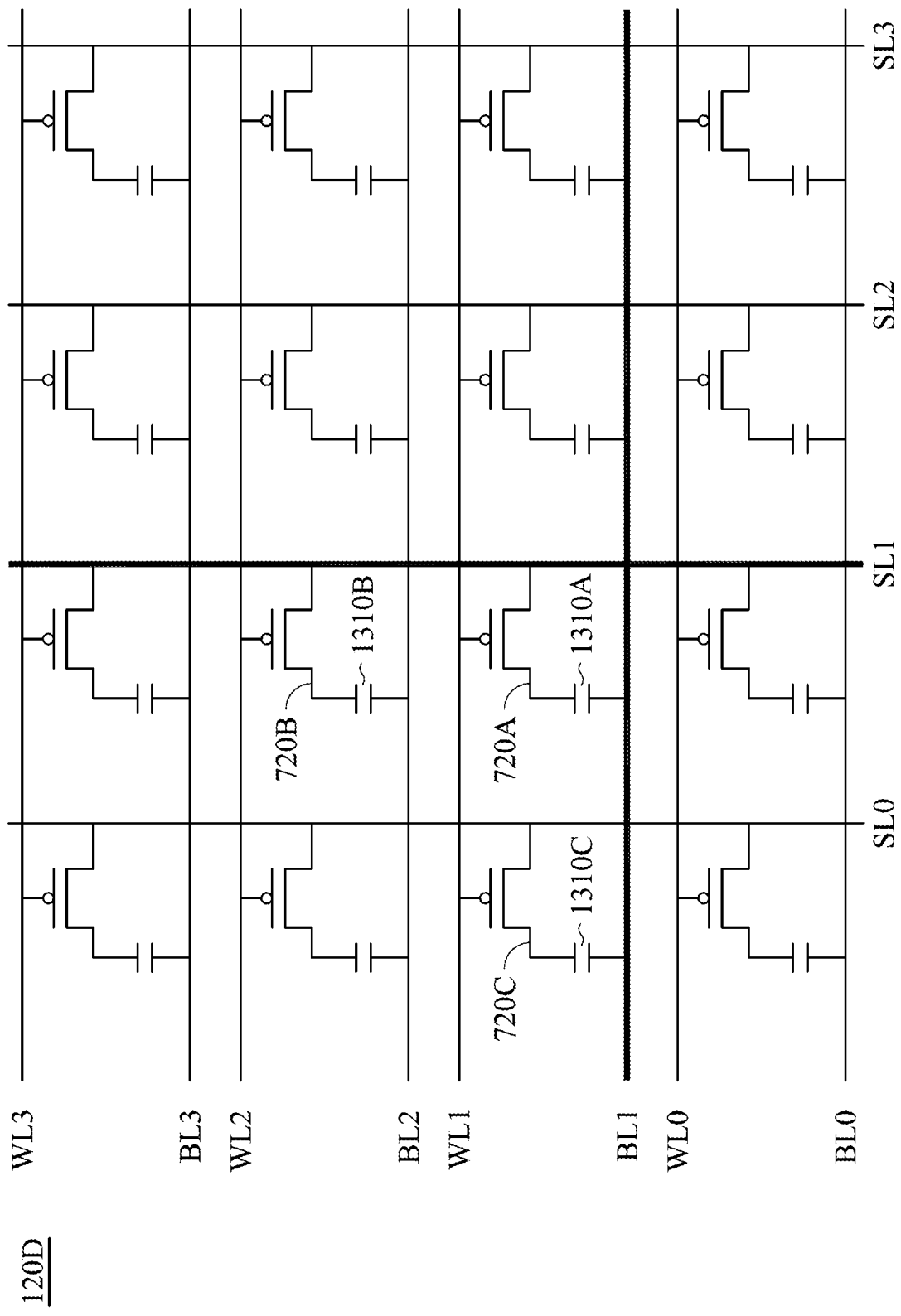
FIG. 13 illustrates a schematic diagram of a memory array, in accordance with some embodiments.

FIG. 13 illustrates a schematic diagram of a memory array 120D, in accordance with some embodiments. The memory array 120D may be a portion of the memory array 120 in FIG. 1. The memory array 120D is similar to the memory array 120B in FIG. 7, except each memory cell 125 in the memory array 120D includes a storage element 1310 instead of the storage element 710. The storage element 1310 may be a MIM capacitor or any capacitor. The memory array 120C may be operated and configured in a similar manner as described above with respect to FIG. 8A, FIG. 8B, FIG. 9A, FIG. 9B, FIG. 10A, FIG. 10B, FIG. 11A, FIG. 11B.

Figure 14:
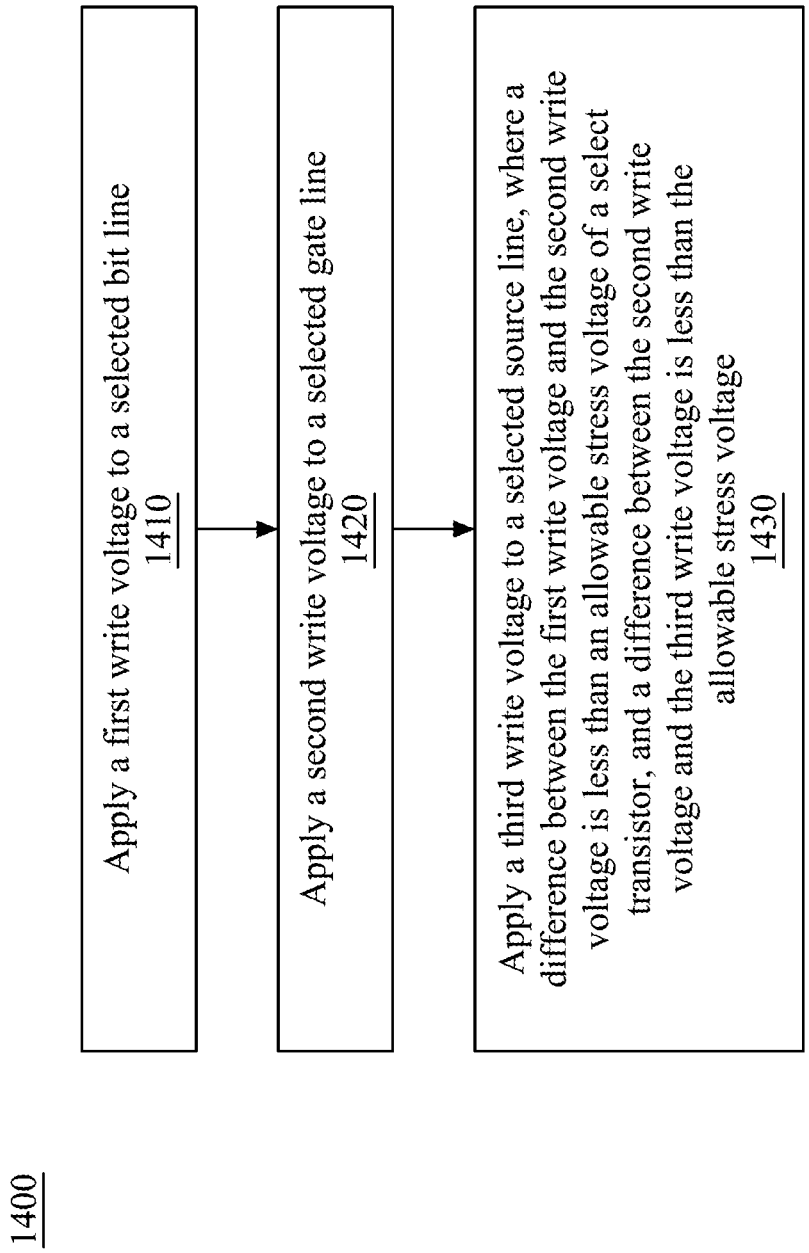
FIG. 14 is a flowchart of writing data to one or more memory cells, in accordance with some embodiments.

FIG. 14 is a flowchart showing a process 1400 of writing data to one or more memory cells 125 by selectively controlling or configuring source lines SL, in accordance with some embodiments. In some embodiments, the process 1400 is performed by the memory controller 105. In some embodiments, the process 1400 is performed by other entities. In some embodiments, the process 1400 includes more, fewer, or different steps than shown in FIG. 14.

In one approach, the memory controller 105 applies 1410 a first write voltage (e.g., VW1) to a selected bit line (e.g., BL1). The selected bit line may be coupled to a selected memory cell (e.g., 125A) and one or more unselected memory cells (e.g., 125B). The bit line controller 112 may apply the first write voltage to the selected bit line while applying a different write voltage (e.g., VW2 or VW3) to unselected bit lines (e.g., BL0, BL2, BL3).

In one approach, the memory controller 105 applies 1420 a second write voltage (e.g., VW2) to a selected word line (e.g., WL1). The selected word line may be coupled to a selected memory cell (e.g., 125A) and one or more unselected memory cells (e.g., 125B). The word line controller 114 may apply the second write voltage to the selected word line while applying a different write voltage (e.g., VW3) to unselected word lines (e.g., WL0, WL2, WL3).

In one approach, the memory controller 105 applies 1430 a third write voltage (e.g., VW3) to a selected source line (e.g., SL2) coupled to the selected memory cell. The selected source line may be coupled to a selected memory cell (e.g., 125A) and one or more unselected memory cells (e.g., 125C). The source line controller 118 may apply the third write voltage to the selected source line while applying a different write voltage (e.g., VW2) to unselected source lines (e.g., SL0, SL2, SL3). By applying the voltages as in the steps 1410, 1420, 1430, the select transistor (e.g., 220) of the selected memory cell (e.g., 125A) can be enabled such that high voltage (e.g., VW1-VW3) can be applied to the storage element (e.g., 210) of the selected memory cell, and the storage element of the selected memory cell can be programmed accordingly. Meanwhile, the select transistors (e.g., 220) of unselected memory cells (e.g., 125B, 125C) may be disabled such that high voltage (e.g., VW1-VW3) may not be applied to the storage elements (e.g., 210) of the unselected memory cells, and the storage elements of the unselected memory cells may not be programmed.

Advantageously, the memory cells may be programmed and operate in a reliable manner. In one aspect, the difference between the write voltages VW2, VW3 may be larger than a threshold voltage of the select transistor 220, but less than an allowable stress voltage of the select transistor 220. In addition, the difference between the write voltages VW1, VW2 may be less than an allowable stress voltage of the select transistor 220. Accordingly, no excessive voltage may be applied to the select transistors 220 during programming, such that the memory cells 125 may be programmed without damaging the select transistors 220. Moreover, each memory cell 125 may have a simple configuration (e.g., 1T1R or 1T1C) to achieve area efficiency.

Figure 15:
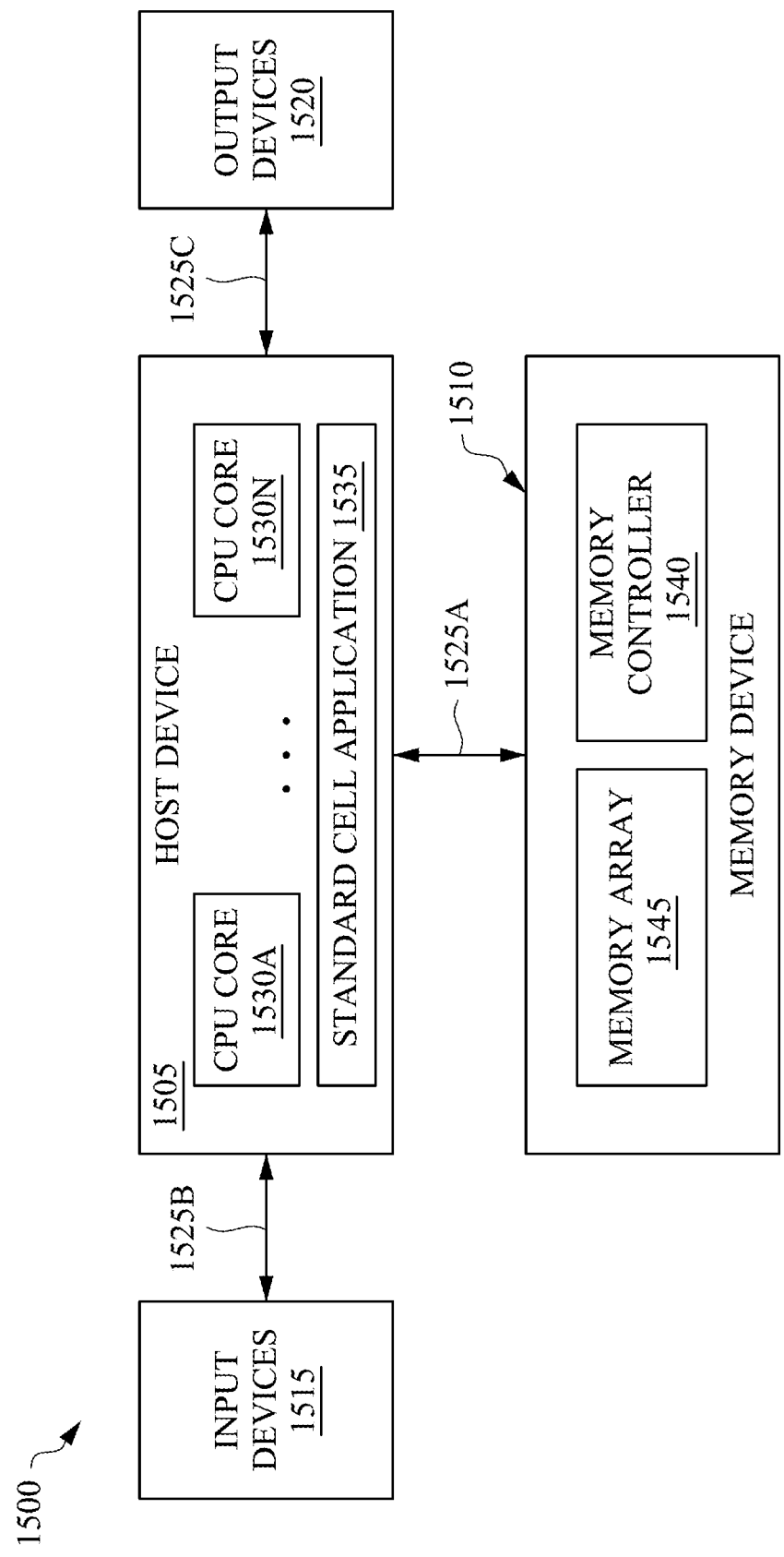
FIG. 15 is an example block diagram of a computing system, in accordance with some embodiments.

Referring now to FIG. 15, an example block diagram of a computing system 1500 is shown, in accordance with some embodiments of the disclosure. The computing system 1500 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1500 includes a host device 1505 associated with a memory device 1510. The host device 1505 may be configured to receive input from one or more input devices 1515 and provide output to one or more output devices 1520. The host device 1505 may be configured to communicate with the memory device 1510, the input devices 1515, and the output devices 1520 via appropriate interfaces 1525A, 1525B, and 1525C, respectively. The computing system 1500 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1505.

The input devices 1515 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1505 and that allows an external source, such as a user (e.g., a circuit or layout designer), to enter information (e.g., data) into the host device and send instructions to the host device. Similarly, the output devices 1520 may include a variety of output technologies such as external memories, printers, speakers, displays, microphones, light emitting diodes, headphones, video devices, and any other output peripherals that are configured to receive information (e.g., data) from the host device 1505. The "data" that is either input into the host device 1505 and/or output from the host device 1505 may include any of a variety of textual data, circuit data, signal data, semiconductor device data, graphical data, combinations thereof, or other types of analog and/or digital data that is suitable for processing using the computing system 1500.

The host device 1505 includes or is associated with one or more processing units/processors, such as Central Processing Unit ("CPU") cores 1530A-1530N. The CPU cores 1530A-1530N may be implemented as an Application Specific Integrated Circuit ("ASIC"), Field Programmable Gate Array ("FPGA"), or any other type of processing unit. Each of the CPU cores 1530A-1530N may be configured to execute instructions for running one or more applications of the host device 1505. In some embodiments, the instructions and data to run the one or more applications may be stored within the memory device 1510. The host device 1505 may also be configured to store the results of running the one or more applications within the memory device 1510. Thus, the host device 1505 may be configured to request the memory device 1510 to perform a variety of operations. For example, the host device 1505 may request the memory device 1510 to read data, write data, update or delete data, and/or perform management or other operations. One such application that the host device 1505 may be configured to run may be a standard cell application 1535. The standard cell application 1535 may be part of a computer aided design or electronic design automation software suite that may be used by a user of the host device 1505 to use, create, or modify a standard cell of a circuit. In some embodiments, the instructions to execute or run the standard cell application 1535 may be stored within the memory device 1510. The standard cell application 1535 may be executed by one or more of the CPU cores 1530A-1530N using the instructions associated with the standard cell application 1535 from the memory device 1510. In one example, the standard cell application 1535 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100, or any portion of the memory device 100 can be fabricated according to the layout design by a fabrication facility.

Referring still to FIG. 15, the memory device 1510 includes a memory controller 1540 that is configured to read data from or write data to a memory array 1545. The memory array 1545 may include a variety of volatile and/or non-volatile memories. For example, in some embodiments, the memory array 1545 may include NAND flash memory cores. In other embodiments, the memory array 1545 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1545 may be individually and independently controlled by the memory controller 1540. In other words, the memory controller 1540 may be configured to communicate with each memory within the memory array 1545 individually and independently. By communicating with the memory array 1545, the memory controller 1540 may be configured to read data from or write data to the memory array 1545 in response to instructions received from the host device 1505. Although shown as being part of the memory device 1510, in some embodiments, the memory controller 1540 may be part of the host device 1505 or part of another component of the computing system 1500 and associated with the memory device 1510. The memory controller 1540 may be implemented as a logic circuit in either software, hardware, firmware, or combination thereof to perform the functions described herein. For example, in some embodiments, the memory controller 1540 may be configured to retrieve the instructions associated with the standard cell application 1535 stored in the memory array 1545 of the memory device 1510 upon receiving a request from the host device 1505.

It is to be understood that only some components of the computing system 1500 are shown and described in FIG. 15. However, the computing system 1500 may include other components such as various batteries and power sources, networking interfaces, routers, switches, external memory systems, controllers, etc. Generally speaking, the computing system 1500 may include any of a variety of hardware, software, and/or firmware components that are needed or considered desirable in performing the functions described herein. Similarly, the host device 1505, the input devices 1515, the output devices 1520, and the memory device 1510 including the memory controller 1540 and the memory array 1545 may include other hardware, software, and/or firmware components that are considered necessary or desirable in performing the functions described herein.

In one aspect of the present disclosure, a memory device is disclosed. In some embodiments, the memory device includes a set of memory cells, where each of the set of memory cells includes a select transistor and a storage element connected in series between a corresponding bit line and a corresponding source line. In some embodiments, the memory device includes a memory controller coupled to the set of memory cells. In some embodiments, the memory controller is configured to apply a first write voltage to a bit line coupled to a selected memory cell of the set of memory cells during a first time period to write data to the selected memory cell. In some embodiments, the memory controller is configured to apply a second write voltage to a word line coupled to a gate electrode of a select transistor of the selected memory cell during the first time period. In some embodiments, the memory controller is configured to apply a third write voltage to a source line coupled to the selected memory cell during the first time period. The second write voltage may be between the first write voltage and the third write voltage.

In another aspect of the present disclosure, a memory system is disclosed. In some embodiments, the memory system includes a memory array including a first memory cell, a second memory cell, a first word line coupled to the first memory cell and the second memory cell, a first source line coupled to the first memory cell, and a second source line coupled to the second memory cell. In some embodiments, the memory system includes a memory controller configured to apply a first write voltage to the first word line during a first time period to write data to the first memory cell, apply a second write voltage to the first source line during the first time period, and apply the first write voltage to the second source line during the first time period.

In yet another aspect of the present disclosure, a method of operating a memory device is disclosed. In some embodiments, the method includes applying, by a memory controller, a first write voltage to a bit line during a time period to write data to a selected memory cell, where the bit line is coupled to the selected memory cell and an unselected memory cell. In some embodiments, the method includes applying, by the memory controller, a second write voltage to a word line during the time period, where the word line is coupled to the selected memory cell and the unselected memory cell. In some embodiments, the method includes applying, by the memory controller, a third write voltage to a first source line during the time period, where the first source line is coupled to the selected memory cell. In some embodiments, the method includes applying, by the memory controller, the second write voltage to a second source line during the time period, where the second source line is coupled to the unselected memory cell.

The term "coupled" and variations thereof includes the joining of two members directly or indirectly to one another. The term "electrically coupled" and variations thereof includes the joining of two members directly or indirectly to one another through conductive materials (e.g., metal or cupper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system:
a set of memory cells, each of the set of memory cells including a select transistor and a storage element connected in series between a corresponding bit line and a corresponding source line; and
a memory controller coupled to the set of memory cells, the memory controller to:
apply a first write voltage to a bit line coupled to a selected memory cell of the set of memory cells during a first time period to write data to the selected memory cell,
apply a second write voltage to a word line coupled to a gate electrode of a select transistor of the selected memory cell during the first time period, and
apply a third write voltage to a source line coupled to the selected memory cell during the first time period, the second write voltage between the first write voltage and the third write voltage,
wherein a first difference between the first write voltage and the second write voltage less than an allowable stress voltage of each select transistor, and a second difference between the second write voltage and the third write voltage less than the allowable stress voltage of each select transistor.

2. The memory system of claim 1, wherein the memory controller is to:
apply the second write voltage to another source line coupled to an unselected memory cell during the first time period, the unselected memory cell coupled to the bit line.

3. The memory system of claim 1, wherein the memory controller is to:
apply the third write voltage to another bit line coupled to an unselected memory cell during the first time period, the unselected memory cell coupled to the source line, and
apply the third write voltage to another word line coupled to another gate electrode of another select transistor of the unselected memory cell during the first time period.

4. The memory system of claim 1, wherein the memory controller is to:
apply the second write voltage to another bit line coupled to an unselected memory cell during the first time period, the unselected memory cell coupled to the source line, and
apply the third write voltage to another word line coupled to another gate electrode of another select transistor of the unselected memory cell during the first time period.

5. The memory system of claim 1, wherein the memory controller is to:
apply a first read voltage to another bit line coupled to another selected memory cell of the set of memory cells during a second time period to read data stored by the another selected memory cell,
apply a second read voltage to another source line coupled to the another selected memory cell during the second time period, and
apply a third read voltage to another word line coupled to another gate electrode of the another selected memory cell during the second time period, the first read voltage between the second read voltage and the third read voltage.

6. The memory system of claim 5, wherein the memory controller is to:
apply the first read voltage to an additional source line coupled to an unselected memory cell during the second time period, the unselected memory cell coupled to the another bit line.

7. The memory system of claim 5, wherein the memory controller is to:
apply the second read voltage to an additional bit line coupled to an unselected memory cell during the second time period, the unselected memory cell coupled to the another source line, and
apply the second read voltage to an additional word line coupled to an additional gate electrode of the unselected memory cell during the second time period.

8. The memory system of claim 1, wherein the memory controller is to:
apply a first read voltage to another bit line coupled to another selected memory cell of the set of memory cells during a second time period to read data stored by the another selected memory cell,
apply a second read voltage to another source line coupled to the another selected memory cell during the second time period, and
apply a third read voltage to another word line coupled to another gate electrode of another select transistor during the second time period, the second read voltage between the first read voltage and the third read voltage.

9. The memory system of claim 8, wherein the memory controller is to:
apply the first read voltage to an additional source line coupled to an unselected memory cell during the second time period, the unselected memory cell coupled to the another bit line.

10. The memory system of claim 8, wherein the memory controller is to:
apply the first read voltage to an additional bit line coupled to an unselected memory cell during the second time period, the unselected memory cell coupled to the another source line, and
apply the first read voltage to an additional word line coupled to an additional gate electrode of the unselected memory cell during the second time period.

11. The memory system of claim 8, wherein the storage element is an e-fuse element.

12. The memory system of claim 8, wherein the storage element is a MTJ cell.

13. The memory system of claim 8, wherein the storage element is a MIM capacitor.

14. The memory system of claim 8, wherein the word line extends in parallel with the bit line along a first direction.

15. A memory system:
a memory array including:
  a first memory cell,
  a second memory cell,
  a first word line coupled to the first memory cell and the second memory cell,
  a first source line coupled to the first memory cell, and
  a second source line coupled to the second memory cell; and
a memory controller to:
  apply a first write voltage to the first word line during a first time period to write data to the first memory cell,
  apply a second write voltage to the first source line during the first time period, and
  apply the first write voltage to the second source line during the first time period.

16. The memory system of claim 15,
wherein the memory array further includes:
  a third memory cell coupled to the first source line,
  a second word line coupled to the third memory cell,
  a first bit line coupled to the first memory cell and the second memory cell, and
  a second bit line coupled to the third memory cell, and
wherein the memory controller is to:
  apply a third write voltage to the first bit line during the first time period, and
  apply the second write voltage to the second bit line and the second word line during the first time period.

17. The memory system of claim 15,
wherein the memory array further includes:
  a third memory cell coupled to the first source line,
  a second word line coupled to the third memory cell,
  a first bit line coupled to the first memory cell and the second memory cell, and
  a second bit line coupled to the third memory cell, and
wherein the memory controller is to:
  apply a third write voltage to the first bit line during the first time period, and
  apply the first write voltage to the second bit line and the second word line during the first time period.

18. A method comprising:
applying, by a memory controller, a first write voltage to a bit line during a time period to write data to a selected memory cell, the bit line coupled to the selected memory cell and an unselected memory cell;
applying, by the memory controller, a second write voltage to a word line during the time period, the word line coupled to the selected memory cell and the unselected memory cell;
applying, by the memory controller, a third write voltage to a first source line during the time period, the first source line coupled to the selected memory cell; and
applying, by the memory controller, the second write voltage to a second source line during the time period, the second source line coupled to the unselected memory cell.

19. The method of claim 18, wherein a first difference between the first write voltage and the second write voltage is less than an allowable stress voltage of each select transistor, and wherein a second difference between the second write voltage and the third write voltage is less than the allowable stress voltage of each select transistor.

* * * * *